United States Patent
Sano

(10) Patent No.: US 7,474,284 B2
(45) Date of Patent: *Jan. 6, 2009

(54) SHIFT REGISTER FOR DRIVING DISPLAY

(75) Inventor: Keiichi Sano, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 570 days.

This patent is subject to a terminal disclaimer.

(21) Appl. No.: 10/837,599

(22) Filed: May 4, 2004

(65) Prior Publication Data

US 2004/0263439 A1    Dec. 30, 2004

(30) Foreign Application Priority Data

Jun. 30, 2003  (JP)  ............... 2003-186154

(51) Int. Cl.
  *G09G 3/30*  (2006.01)
(52) U.S. Cl. ........................................ 345/76
(58) Field of Classification Search ................ 345/87, 345/98, 100, 204, 76; 377/64–81; 326/63; 327/91, 94, 241; 340/825.68
  See application file for complete search history.

(56) References Cited

U.S. PATENT DOCUMENTS

| | | | | | |
|---|---|---|---|---|---|
| 3,573,490 | A | * | 4/1971 | Sevin et al. | 377/79 |
| 4,587,446 | A | * | 5/1986 | Okumura | 326/58 |
| 5,222,082 | A | * | 6/1993 | Plus | 377/79 |
| 5,410,583 | A | * | 4/1995 | Weisbrod et al. | 377/75 |
| 5,517,542 | A | * | 5/1996 | Huq | 377/78 |
| 5,631,940 | A | * | 5/1997 | Fujikura | 377/64 |
| 5,701,136 | A | * | 12/1997 | Huq et al. | 345/100 |
| 5,949,398 | A | * | 9/1999 | Kim | 345/100 |
| 6,064,713 | A | * | 5/2000 | Lebrun et al. | 377/67 |
| 6,144,374 | A | * | 11/2000 | Hyun | 345/204 |
| 6,163,310 | A | * | 12/2000 | Jinno et al. | 345/87 |
| 6,215,840 | B1 | * | 4/2001 | Malaviya et al. | 377/57 |
| 6,339,631 | B1 | * | 1/2002 | Yeo et al. | 377/64 |
| 6,345,085 | B1 | * | 2/2002 | Yeo et al. | 377/54 |
| 6,414,670 | B1 | * | 7/2002 | Kim | 345/98 |
| 6,621,886 | B2 | * | 9/2003 | Kawahata | 377/1 |
| 2002/0047826 | A1 | * | 4/2002 | Akimoto et al. | 345/100 |

FOREIGN PATENT DOCUMENTS

| | | | |
|---|---|---|---|
| JP | 02027598 | * | 1/1990 |
| JP | 2002-328643 | | 11/2002 |

OTHER PUBLICATIONS

Kishino, Seigo, "Basis of Semiconductor Device." Ohmsha, Ltd., Apr. 25, 1985, pp. 4 (Total).
"Sub-micron Device I." Jul. 31, 1987, pp. 49-51.

* cited by examiner

Primary Examiner—Sumati Lefkowitz
Assistant Examiner—Robert E Carter, III
(74) Attorney, Agent, or Firm—McDermott Will & Emery LLP

(57) ABSTRACT

A display capable of suppressing the increase in current consumption is disclosed. The display comprises a first transistor connected to a first potential, a second transistor connected to a second potential, a third transistor for turning off the first transistor when the second transistor is in on state, a fourth transistor connected to the first potential, a fifth transistor connected to the second potential, and a sixth transistor operated to turn off when the third transistor is in on state and also operated to turn off the fourth transistor when the fifth transistor is in on state.

19 Claims, 11 Drawing Sheets

SHIFT REGISTER FOR DRIVING DISPLAY

CROSS-REFERENCE TO RELATED APPLICATIONS

The priority application Number JP 2003-186154 upon which this patent application is based is hereby incorporated by reference.

BACKGROUND OF THE INVENTION

1. Field of the Invention

The present invention relates to a display, or in particular to a display having shift register circuits.

2. Description of the Background Art

A conventional inverter circuit of resistance load type having a load resistance is known. This inverter circuit is disclosed, for example, in Seigo Kishino: "Basis of Semiconductor Device" published by Ohmsha, Ltd., pp. 184-187, Apr. 25, 1985.

Also, a conventional shift register circuit having the inverter circuit of resistance load type described above is known. The shift register circuit is used with a circuit for driving the gate line and the drain line of, for example, a liquid crystal display and an organic EL display. FIG. 13 is a circuit diagram of the conventional shift register circuit having an inverter circuit of resistance load type. The conventional first-stage shift register circuit 104a1 shown in FIG. 13 is configured of a first circuit section 104b1 and a second circuit section 104c1. The shift register circuit 104a2 in the stage following the shift register circuit 104a1 is configured of a first circuit section 104b2 and a second circuit section 104c2.

The first circuit section 104b1 of the first-stage shift register circuit 104a includes n-channel transistors NT101, NT102, a capacitor C101 and a resistor R101. In the description of the prior art that follows, the n-channel transistors NT101, NT102, NT103 are referred to as the transistors NT101, NT102, NT103, respectively. The drain of the transistor NT101 is supplied with a start signal ST, and the source thereof is connected to a node ND101. The gate of the transistor NT101 is connected to a clock signal line CLK1. Also, the source of the transistor NT102 is connected to the negative potential (VSS), and the drain thereof is connected to a node ND102. Further, one of the electrodes of the capacitor C101 is connected to the negative potential (VSS), and the other electrode thereof is connected to the node ND101. A resistor R101 is interposed between the node ND102 and the positive potential (VDD). The transistor NT102 and the resistor R101 make up an inverter circuit.

The second circuit section 104c1 of the first-stage shift register circuit 104a1 is configured of an inverter circuit including a transistor NT103 and a resistor R102. The source of the transistor NT103 is connected to the negative potential (VSS), while the drain thereof is connected to the node ND103. The gate of the transistor NT103 is connected to the node ND102 of the first circuit section 104b1. A resistor R102 is interposed between the node ND103 and the positive potential (VDD). An output signal SR1 of the first-stage shift register circuit 104a1 is output from the node ND103. The node ND103 is connected with the first circuit section 104b2 of the second-stage shift register circuit 104a2.

The shift register circuits in the second and subsequent stages are configured similarly to the first-stage shift register circuit 104a1. The first circuit section of the shift registers in the following stage is connected to the output node of the shift register circuit in the preceding stage.

FIG. 14 is a timing chart of the conventional shift register circuit shown in FIG. 13. Next, with reference to FIGS. 13 and 14, the operation of the conventional shift register circuit is explained.

First, a L-level start signal ST is input as an initial mode. After the start signal ST is raised to H level, the clock signal CLK1 is raised to H level. As a result, the gate of the transistor NT101 of the first circuit section 104b1 of the first-stage shift register circuit 104a1 is supplied with the H-level clock signal CLK1, thereby turning on the transistor NT101. Thus, the H-level start signal ST is applied to the gate of the transistor NT102 thereby to turn on the transistor NT102. The potential of the node ND102 is then reduced to L level, and therefore the transistor NT103 is turned off. The potential of the node ND103 increases so that a H-level signal is output as an output signal SR1 from the first-stage shift register 104a1. This H-level signal is supplied also to the first circuit section 104b2 of the second-stage shift register circuit 104a2. By the way, the H-level potential is stored in the capacitor C101 as long as the clock signal CLK1 is at H level.

Next, the clock signal CLK1 is reduced to L level. As a result, the transistor NT101 is turned off. After that, the start signal ST is reduced to L level. In the process, even though the transistor NT101 turns off, the potential of the node ND101 is held at H level by the H-level potential stored in the capacitor C101, and therefore the transistor NT102 is kept on. Since the potential of the node ND102 is held at L level, the gate potential of the transistor NT103 is held at L level. As a result, the transistor NT103 is kept off, and therefore, a H-level output signal continues to be output as an output signal SR1 from the second circuit section 104c1 of the first-stage shift register circuit 104a1.

The clock signal CLK2 input to the first circuit section 104b2 of the second-stage shift register circuit 104a2 is raised to H level. In the second-stage shift register circuit 104a2, therefore, the H-level clock signal CLK2 is input with the H-level output signal SR1 input from the first-stage shift register circuit 104a1. Thus, the operation similar to the first-stage shift register circuit 104a1 is performed. As a result, a H-level output signal SR2 is output from the second circuit section 104c2 of the second-stage shift register circuit 104a2.

After that, the clock signal CLK1 is raised again to H level. The transistor NT101 of the first circuit section 104b1 of the first-stage shift register circuit 104a1 is turned on. In the process, the potential of the node ND101 drops to L level since the start signal ST is at L level. The transistor NT102 turns off, and therefore the potential of the node ND102 is raised to H level. As a result, the transistor NT103 is turned on, and the potential of the node ND103 is reduced to L level from H level. The L-level output signal SR1 is output from the second circuit section 104c1 of the first-stage shift register circuit 104a1. By the operation described above, H-level output signals (SR1, SR2, SR3 and so forth) shifted in timing are sequentially output from the shift register circuits in the respective stages.

In the first-stage shift register circuit 104a1 of the conventional shift register circuit shown in FIG. 13, however, the transistor NT102 is held in on state during the period when the output signal SR1 is at H level, and therefore, a through current inconveniently flows between the positive potential VDD and the negative potential VSS through the resistor R101 and the transistor NT102. Also, during the L-level period of the output signal SR1, the transistor NT103 is held on, and therefore, the through current inconveniently flows between the positive potential (VDD) and the negative potential (VSS) through the resistor R102 and the transistor NT103. Regardless of whether the output signal SR1 is at H level or L level, therefore, the through current always inconveniently flows between the positive potential (VDD) and the negative potential (VSS). The shift register circuits in other stages also have a similar configuration to the first-stage shift register circuit 104a1. Like the first-stage shift register circuit 104a1, therefore, the through current always inconveniently flows between the positive potential VDD and the negative potential VSS regardless of whether the output signal is at H or L level. As a result, in the case where the conventional shift register circuit described above is used as a circuit for driving the gate line or the drain line of a liquid crystal display or an organic EL display, the problem is posed that the current consumption of the liquid crystal display or the organic EL display, as the case may be, increases.

SUMMARY OF THE INVENTION

The present invention has been achieved to provide a display capable of suppressing the increase in current consumption.

In order to solve the problem described above, according to a first aspect of the invention, there is provided a display comprising a shift register circuit including a first circuit section having a first transistor of first conductive type connected to the first potential and operated to turn on in response to the clock signal, a second transistor of first conductive type connected to the second potential and a third transistor of first conductive type connected between the gate of the first transistor and the second potential for turning off the first transistor when the second transistor is in on state, and a second circuit section having a fourth transistor of first conductive type connected to the first potential and operated to turn on in response to the clock signal, a fifth transistor of first conductive type connected to the second potential, and a sixth transistor of first conductive type connected between the gate of the fourth transistor and the second potential and operated to turn off when the third transistor is in on state on the one hand and to turn off the fourth transistor when the fifth transistor in on state on the other hand.

In the display according to the first aspect, the first transistor connected to the first potential and the second transistor connected to the second potential are prevented from turning on at the same time, and therefore the through current is prevented from flowing between the first and second potentials through the first and second transistors in the first circuit section. Also, the provision of the sixth transistor of the second circuit section for turning off the fourth transistor when the fifth transistor is in on state prevents the fourth transistor connected to the first potential and the fifth transistor connected to the second potential from turning on at the same time. In the second circuit section, therefore, the through current is prevented from flowing between the first and second potentials through the fourth and fifth transistors. In this way, the through current is prevented from flowing in the first and second circuit sections, and therefore the increase in the current consumption can be suppressed. Also, the use of the clock signal to turn on the first and fourth transistors limits the turn-on time of the clock signal to a predetermined period. As compared with a case using a continuous on signal for turning on the first and fourth transistors, therefore, the period during which the on signal is supplied is shortened. As a result, in the case where the clock signal is turned on when the third transistor is on in the first circuit section, the period during which the through current flows through the third transistor between the second potential and the clock signal line for supplying the clock signal can be shortened. Also, in the case where the clock signal is turned on when the sixth transistor is on in the second circuit section, the period during which the through current flows through the sixth transistor between the second potential and the clock signal line for supplying the clock signal can be shortened. In this way, the period during which the through current flows in the first and second circuit sections can be shortened, and therefore the increase in current consumption is suppressed. Also, since the sixth transistor is configured to turn off when the third transistor is in on state, the third and sixth transistors are prevented from turning on at the same time. Therefore, the through current is prevented from flowing through the first and second circuit sections at the same time, thereby also suppressing the current consumption from increasing. Also, since the first, second, third, fourth, fifth and sixth transistors are formed in first conductive type, the number of the ion injection steps and the number of the ion injection masks can be reduced as compared with a case where a shift register circuit including transistors of two operated to types is formed. As a result, the fabrication process can be simplified while at the same time reducing the fabrication cost.

DESCRIPTION OF THE PREFERRED EMBODIMENTS

Embodiments of this invention are described below with reference to the accompanying drawings.

First Embodiment

Figure 1:
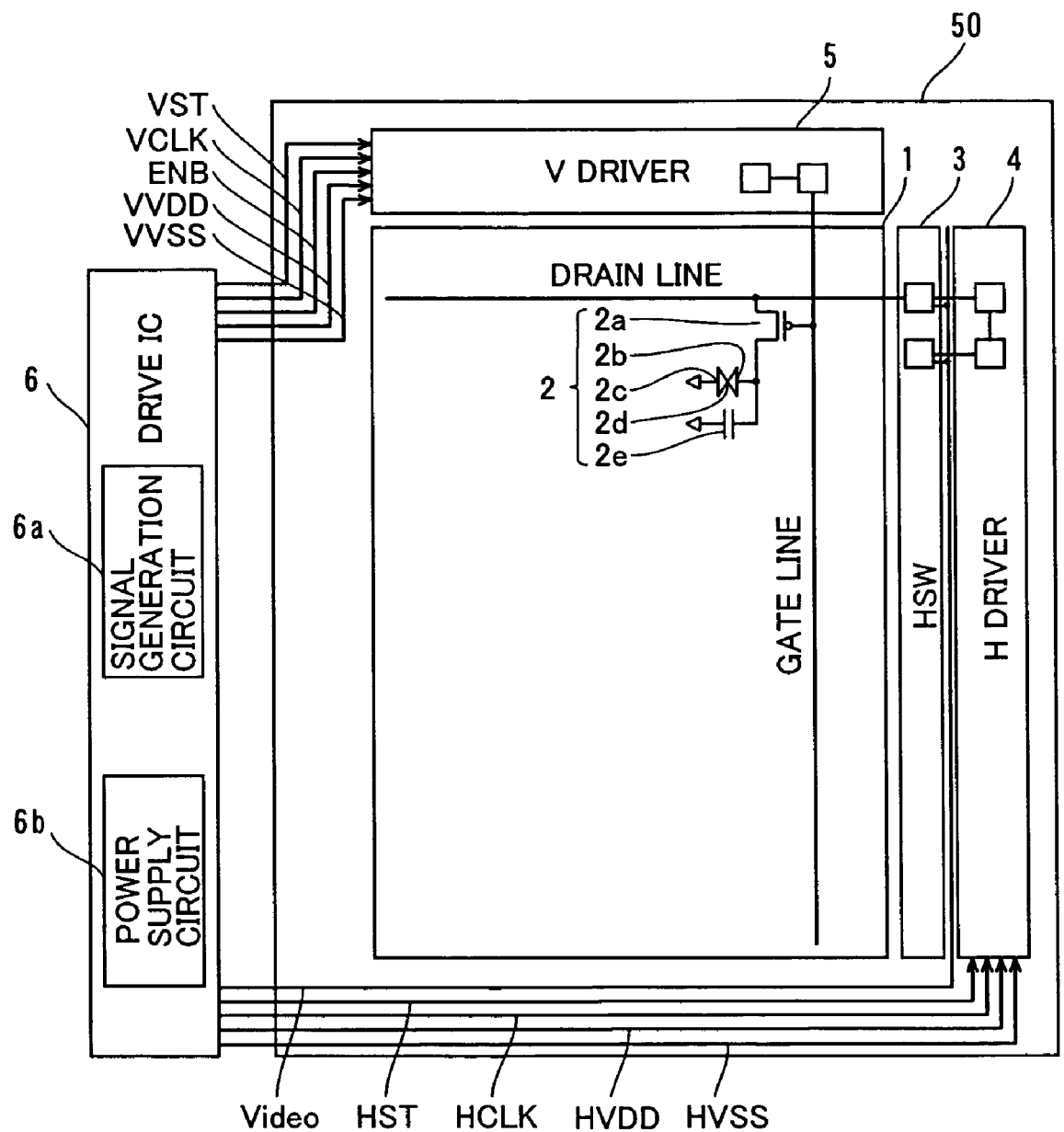
FIG. 1 is a plan view showing a liquid crystal display according to a first embodiment of the invention.

According to a first embodiment of the invention shown in FIG. 1, a display section 1 is arranged on a substrate 50. The display section 1 shown in FIG. 1 represents a configuration having one pixel. In the display section 1, pixels 2 are arranged in matrix form. Each pixel 2 is configured of a p-channel transistor 2a, a pixel electrode 2b, an opposite electrode 2c arranged in opposed relation to the pixel electrode 2b and shared by the pixels 2, a liquid crystal 2d held between the pixel electrode 2b and the opposite electrode 2c, and an auxiliary capacitor 2e. The gate of the p-channel transistor 2a is connected to the gate line. The drain of the p-channel transistor 2a is connected to the drain line. The source of the p-channel transistor 2a is connected with the pixel electrode 2b and the auxiliary capacitor 2e.

Along one side of the display section 1, a horizontal switch (HSW) 3 and a H driver 4 for driving (scanning) the drain line of the display section 1 are arranged on the substrate 50. Also, along the other side of the display section 1, a V driver 5 is arranged on the substrate 50 for driving (scanning) the gate line of the display section 1. In FIG. 1, although only two horizontal switches HSW are shown, switches HSW in the number corresponding to that of the pixels are actually arranged. Also, in spite of the fact that only two shift registers are shown for the H driver 4 and the V driver 5, shift registers in the number corresponding to the number of the pixels are actually arranged. A drive IC 6 is arranged outside of the substrate 50. This drive IC 6 includes operated to 6a and a operated to 6b. A video signal Video, a start signal HST, a clock signal HCLK, a positive potential HVDD and a negative potential HVSS are supplied from the drive IC 6 to the H driver 4. Also, a start signal VST, a clock signal VCLK, an enable signal ENB, a positive potential VVDD and a negative potential VVSS are supplied from the drive IC 6 to the V driver 5.

Figure 2:
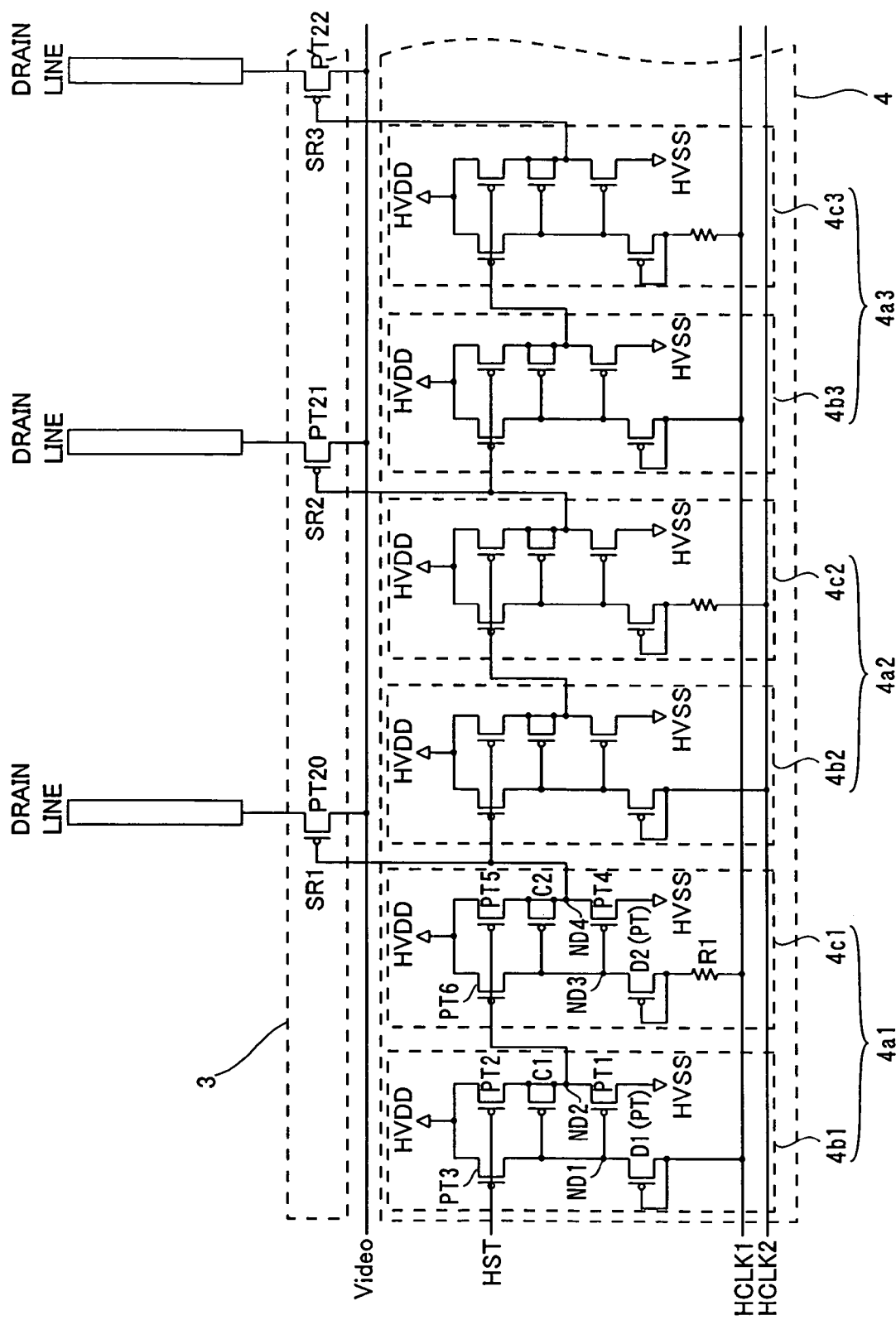
FIG. 2 is a circuit diagram showing a shift register circuit constituting a H driver of the liquid crystal display according to the first embodiment shown in FIG. 1.

As shown in FIG. 2, the H driver 4 includes a plurality of stages of shift register circuits 4a1, 4a2, 4a3 therein. Although only three stages of the shift register circuits 4a1, 4a2, 4a3 are shown in FIG. 2 to simplify the drawing, stages of shift register circuits in the number corresponding to the number of pixels are actually arranged. The first-stage shift register circuit 4a1 is configured of a first circuit section 4b1 and a second circuit section 4c1. The first circuit section 4b1 of the first-stage shift register circuit 4a1 includes three p-channel transistors (PT1, PT2 and PT3), a capacitor C1 formed by connecting the source and the drain of the p-channel transistors, and a diode D1 formed by diode-connecting the p-channel transistors. The second circuit section 4c1 of the first-stage shift register circuit 4a1, on the other hand, includes three p-channel transistors (PT4, PT5 and PT6), a capacitor C2 formed by connecting the source and the drain of the p-channel transistors, a diode D2 formed by diode-connecting the p-channel transistors, and a high resistance R1.

The p-channel transistors PT1, PT2, PT3, PT4, PT5 and PT6 are an example of "the first transistor", "the second transistor", "the third transistor", "the fourth transistor", "the fifth transistor" and "the sixth transistor", respectively, according to the invention. Also, the diodes D1 and D2 are an example of "the first diode" and "the second diode", respectively, according to the invention. The capacitors C1 and C2 are an example of "the first capacitor" and "the second capacitor", respectively, according to the invention. The high resistance R1 is an example of "the high resistance" according to the invention.

According to the first embodiment, the p-channel transistors PT1 to PT6 of the first circuit section 4b1 and the second circuit section 4c1, the p-channel transistors making up the capacitors C1, C2, and the p-channel transistors making up the diodes D1, D2 are each constituted of TFTs (thin film transistors) formed of a p-type MOS transistor (field effect transistor). In the first embodiment, the p-channel transistors PT1 to PT6 are hereinafter referred to as the transistors PT1 to PT6, respectively.

In the first circuit section 4b1, the drain of the transistor PT1 is connected to the negative potential (HVSS). The negative potential (HVSS) is an example of "the first potential" according to the invention. The negative potential (HVSS) is supplied from the drive IC 6 (FIG. 1). The source of the transistor PT1 is connected to the drain of the transistor PT2. The gate of the transistor PT1 is connected to the clock signal line HCLK1. The source of the transistor PT2 is connected to the positive potential (HVDD). The positive potential (HVDD) is an example of "the second potential" according to the invention. The positive potential (HVDD) is supplied from the drive IC 6 (FIG. 1). Also, the gate of the transistor PT2 is supplied with the start signal HST. This start signal HST is an example of "the first signal" according to the invention.

According to the first embodiment, the transistor PT3 for turning off the transistor PT1 when the transistor PT2 is in on state is connected between the positive potential (HVDD) and the node ND1 connected with the gate of the transistor PT1. As a result, the transistors PT2 and PT1 are prevented from turning on at the same time. Also, the gate of the transistor PT3 is supplied with the start signal HST.

According to the first embodiment, the capacitor C1 is inserted between the gate and the source of the transistor PT1. The diode D1 is connected between the clock signal line HCLK1 and the node ND1 connected with the gate of the transistor PT1. The diode D1 prevents the H-level pulse voltage of the clock signal from flowing in reverse direction toward the capacitor C1 from the clock signal line HCLK1.

In the second circuit section 4c1, the drain of the transistor PT4 is connected to the negative potential (HVSS). The source of the transistor PT4 is connected with the drain of the transistor PT5. The gate of the transistor PT4 is connected to the clock signal line HCLK1. The source of the transistor PT5 is connected to the positive potential (HVDD). The gate of the transistor PT5 is connected to the node ND2 of the first circuit section 4b1.

According to the first embodiment, the transistor PT6 for turning off the transistor PT4 when the transistor PT5 is in on state is inserted between the positive potential (HVDD) and the node ND3 connected with the gate of the transistor PT4. Thus, the transistors PT5 and PT4 are prevented from turning on at the same time. Also, the gate of the transistor PT6 is connected to the node ND2 of the first circuit section 4b1.

According to the first embodiment, the capacitor C2 is interposed between the gate and the source of the transistor PT4. The diode D2 is inserted between the clock signal line HCLK1 and the node ND3 connected with the gate of the transistor PT4. This diode D2 prevents the H-level pulse voltage of the clock signal from flowing in reverse direction from the clock signal line HCLK1 to the capacitor C2.

According to the first embodiment, the high resistance R1 having a resistance value of about 100 kΩ is inserted between the clock signal line HCLK1 and the node ND3 connected with the gate of the transistor PT4. This makes it difficult for the transistor PT4 to turn on, and therefore the response rate is decreased for turning on the transistor PT4, while the response rate is increased for turning off the transistor PT4. Thus, the signal output from the second circuit section 4c1 when the transistor PT4 is in off state can be delayed, while at the same time increasing the speed of the signal output from the second circuit section 4c1 when the transistor PT4 is turned off.

The output signal SR1 of the first-stage shift register circuit 4a1 is output from the node ND4 (output node) interposed between the source of the transistor PT4 and the drain of the transistor PT5. The output signal SR1 is supplied to the horizontal switch 3. As shown in FIG. 2, the horizontal switch 3 includes a plurality of transistors PT20, PT21, PT22. The gates of the transistors PT20, PT21, PT22 are connected to the outputs SR1, SR2, SR3, respectively, of the first- to third-stage shift register circuits 4a1 to 4a3. The drains of the transistors PT20 to PT22 are connected to the drain lines of the stages, respectively. The sources of the transistors PT20, PT21, PT22 are connected to the single video signal line Video. The node ND4 (output node) of the first-stage shift register circuit 4a1 is connected with the first circuit section 4b2 of the second-stage shift register circuit 4a2.

The second-stage shift register circuit 4a2 is configured of the first circuit section 4b2 and the second circuit section 4c2.

The first circuit section 4b2 and the second circuit section 4c2 of the second-stage shift register circuit 4a2 have a similar configuration to the first circuit section 4b1 and the second circuit section 4c1, respectively, of the first-stage shift register circuit 4a1. The output signal SR2 is output from the output node of the second-stage shift register circuit 4a2. The output node of the second-stage shift register circuit 4a2 is connected to the gate of the transistor PT21 of the horizontal switch 3. The source of the transistor PT21 is connected with the video signal line Video. The drain of the transistor PT21 is connected with the drain line. The output node of the second-stage shift register circuit 4a2 is connected with the first circuit section 4b3 of the third-stage shift register circuit 4a3.

The third-stage shift register circuit 4a3 is configured of the first circuit section 4b3 and the second circuit section 4c3. The first circuit section 4b3 and the second circuit section 4c3 of the third-stage shift register circuit 4a3 have a similar configuration to the first circuit section 4b1 and the second circuit section 4c1, respectively, of the first-stage shift register circuit 4a1. The output signal SR3 is output from the output node of the third-stage shift register circuit 4a3. The output node of the third-stage shift register circuit 4a3 is connected with the gate of the transistor PT22 of the horizontal switch 3. The source of the transistor PT21 is connected with the video signal line Video. The drain of the transistor PT21 is connected with the drain line. Also, the output node of the third-stage shift register circuit 4a3 is connected with the first circuit section of the fourth-stage shift register circuit (not shown).

The shift register circuits in the fourth and subsequent stages have a similar configuration to the first- to third-stage shift register circuits 4a1 to 4a3. The second-stage shift register circuit 4a2 is connected with the clock signal line HCLK2. The third-stage shift register circuit 4a3, like the first-stage shift register circuit 4a1, is connected with the clock signal line HCLK1. In this way, the plurality of stages of the shift register circuits are connected to the clock signal line HCLK1 and the clock signal line HCLK2 alternately with each other. The first circuit section of the shift register circuit in the following stage is connected with the output node of the shift register circuit in the preceding stage.

Figure 3:
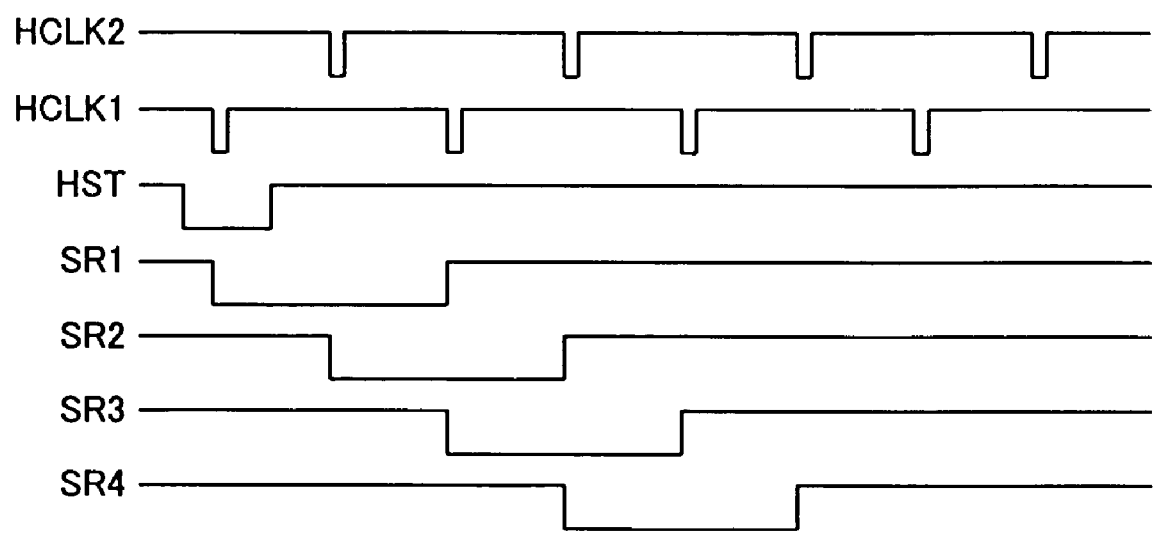
FIG. 3 is a timing chart of a shift register circuit for the H driver of the liquid crystal display according to the first embodiment shown in FIG. 1.

With reference to FIGS. 2 and 3, the operation of the shift register circuit of the H driver of the liquid crystal display according to the first embodiment is explained. In FIG. 3, reference characters SR1, SR2, SR3 and SR4 designate the output signals from the first-, second-, third- and fourth-stage shift register circuits, respectively.

In the initial mode, the H-level start signal HST is input to the first circuit section 4b1 of the first-stage shift register circuit 4a1. The transistors PT2 and PT3 are thus turned off, while the transistor PT1 is turned on. Therefore, the potential of the node ND2 drops to L level. The transistors PT5 and PT6 are turned on. The turning on of the transistor PT6 raises the potential of the node ND3 to H level, so that the transistor PT4 is turned off. Since the transistor PT5 is turned on while the transistor PT4 is turned off, the potential of the node ND4 rises to H level. In the initial mode, therefore, the H-level output signal SR1 is output from the first-stage shift register circuit 4a1.

Under this condition, the transistors PT2 and PT3 are turned on when the L-level start signal HST is input. The potential of the nodes ND1 and ND2 both rise to H level, and therefore the transistor PT1 is turned off. Since the potential of the node ND2 rises to H level, the transistors PT5 and PT6 of the second circuit section 4c1 turn off. In the process, the potential of the node ND3 is held at H level, and therefore the transistor PT4 is held in off state. The potential of the node ND4 is held at H level. Thus, the H-level output signal SR1 is output from the first-stage shift register circuit 4a1.

Next, the L-level clock signal HCLK1 is input through the diode D1. Since the transistor PT3 is in on state, the potential of the node ND1 is held at H level. As a result, the transistor PT1 is held in off state. Incidentally, during the period when the clock signal HCLK1 is at L level, the through current flows between the clock signal line HCLK1 and the positive potential (HVDD) through the diode D1 and the transistor PT3.

In the process, according to the first embodiment, the clock signal HCLK1 is set to a L-level period shorter than a H-level period. Specifically, during the period when the clock signal is at L level, the duty factor is set to about 1/30 (L-level period: about 80 nsec to about 160 nsec). Thus, the period during which the through current flows between the clock signal line HCLK1 and the positive potential (HVDD) is limited to a short length of time of about 80 nsec to about 160 nsec when the clock signal is at L level.

The second circuit section 4c1 is also supplied with the L-level clock signal HCLK1 through the high resistance R1 and the diode D2. In the process, the transistor PT6 is in off state, and therefore, the potential of the node ND3 drops to L level, thereby turning on the transistor PT4.

According to the first embodiment, the high resistance R1 makes it difficult for the transistor PT4 to turn on, and therefore the response rate for turning on the transistor PT4 is reduced.

Since the transistor PT5 is in off state, the potential of the node ND4 drops to the negative potential (HVSS) through the transistor PT4 in on state. In this case, the potential of the node ND3 drops with the decrease in the potential of the node ND4 in such a manner that the gate-source voltage of the transistor PT4 is maintained by the capacitor C2. Also, in view of the fact that the transistor PT6 is in off state and the H-level signal is prevented from flowing through the diode D2 in reverse direction from the clock signal line HCLK1 toward the node ND3, the holding voltage of the capacitor C2 (the gate-source voltage of the transistor PT4) is maintained. Thus, with the decrease in the potential of the node ND4, the transistor PT4 is normally kept on, and therefore the potential of the node ND4 providing an output potential drops to HVSS. As a result, the L-level output signal SR1 is output from the second circuit section 4c1.

Next, when the start signal HST input to the first circuit section 4b1 rises to H level, the transistors PT2 and PT3 are turned off. In this case, the nodes ND1 and ND2 are held floating at H level. Thus, the other parts are not affected, and therefore the L-level output signal SR1 from the second circuit section 4c1 is maintained.

Then, the L-level clock signal is input from the clock signal line HCLK1 through the diode D1 of the first circuit section 4b1. The transistor PT1 is turned on. The potential of the node ND2 drops to the negative potential (HVSS). In this case, the potential of the node ND1 drops with the decrease in the potential of the node ND2 in such a manner that the gate-source voltage of the transistor PT1 is maintained by the capacitor C1. Also, the transistor PT3 is in off state and the H-level signal from the clock signal line HCLK1 is prevented from flowing in reverse direction through the diode D1 toward the node ND1, and therefore the holding voltage of the capacitor C1 (the gate-source voltage of the transistor PT1) is maintained. Thus, with the decrease in the potential of the node ND2, the transistor PT1 is normally kept on, and therefore the potential of the node ND2 drops to L-level HVSS. Thus, the transistors PT5 and PT6 of the second circuit section 4c1 are turned on.

According to the first embodiment, the transistor PT4 is turned off by the transistor PT6 when the transistor PT6 is in on state, and therefore the transistors PT5 and PT4 are prevented from turning on at the same time. Thus, the through current is prevented from flowing between the positive potential (HVDD) and the negative potential (HVSS) through the transistors PT4 and PT5.

The transistor PT5 is turned on while the transistor PT4 is turned off, so that the potential of the node ND4 rises to H level of the positive potential (HVDD) from HVSS. The H-level output signal SR1 is thus output from the second circuit section 4c1.

As described above, with the shift register circuit 4a1 according to the first embodiment, the L-level output signal SR1 is output from the second circuit section 4c1 in the case where the L-level clock signal HCLK1 is input with the L-level start signal HST input to the first circuit section 4b1. In the case where the L-level clock signal HCLK1 is input again with the L-level output signal SR1 output from the second circuit section 4c1, the output signal SR1 from the second circuit section 4c1 rises to H level.

The output signal from the second circuit section 4c1 of the first-stage shift register circuit 4a1 is input to the first circuit section 4b2 of the second-stage shift register circuit 4a2. In the second-stage shift register circuit 4a2, in the case where the H-level clock signal HCLK1 and the L-level clock signal HCLK2 are input when the 1st first circuit section 4b2 is supplied with the L-level output signal SR1 of the first-stage shift register circuit 4a1, the L-level output signal SR2 is output from the 2nd first circuit section 4c2. Further, in the third-stage shift register circuit 4a3, in the case where the L-level clock signal HCLK1 and the H-level clock signal HCLK2 are input when the 1st first circuit section 4b3 is supplied with the L-level output signal SR2 of the second-stage shift register circuit 4a2, the L-level output signal SR3 is output from the 2nd first circuit section 4c3. In this way, the output signal from the shift register circuit in the preceding stage is input to the shift register circuit in the next stage, while the clock signals HCLK1 and HCLK2 operated to drop to L level at different timing are input to the shift register circuit of each stage alternately with each other. As a result, the timing at which the L-level output signal is output from the shift register circuit of each stage is shifted.

The L-level signals with the timing shifted are input to the gate of the transistors PT20, PT21 and PT22 of the horizontal switch 3, so that the transistors PT20, PT21 and PT22 are turned on sequentially. The video signal is supplied from the video signal line Video to the drain line of each stage thereby sequentially driving (scanning) the drain line of each stage. Upon complete scanning of the drain lines of all the stages connected to one gate line, the next gate line is selected. After the drain lines of each stage are sequentially scanned again, the next gate line is selected. This operation is repeated till the end of scanning the drain lines of each stage connected to the last gate line, thereby completing the scanning of one screen.

According to the first embodiment, as described above, the first circuit section 4b1 includes the transistor PT3 for turning off the transistor PT1 when the transistor PT2 is in on state. Thus, the transistor PT1 connected to the negative potential (HVSS) and the transistor PT2 connected to the positive potential (HVDD) are prevented from turning on at the same time. Thus, the through current can be prevented from flowing between the negative potential (HVSS) and the positive potential (HVDD) through the transistor PT1 and the transistor PT2 in the first circuit section 4b1. Also, since the second circuit section 4c1 includes the transistor PT6 for turning off the transistor PT4 when the transistor PT5 is in on state, the transistor PT4 connected to the negative potential (HVSS) and the transistor PT5 connected to the positive potential (HVDD) are prevented from turning on at the same time. Thus, the through current can be prevented from flowing between the negative potential (HVSS) and the positive potential (HVDD) through the transistor PT4 and the transistor PT5 of the second circuit section 4c1. In this way, the through current can be prevented from flowing in the first circuit section 4b1 and the second circuit section 4c1, and therefore the increase in the current consumption of the liquid crystal display can be suppressed.

According to the first embodiment, the clock signal is used to turn on the transistors PT1 and PT4, and the duty factor of the clock signal is set to as short as about 1/30. Thus, the period during which the L-level signal is supplied is shortened. In the case where the clock signal drops to L level when the transistor PT3 is in on state in the first circuit section 4b1, therefore, the period during which the through current flows through the transistor PT3 between the clock signal line HCLK1 for supplying the clock signal and the positive potential (HVDD) can be shortened. Also, in the case where the clock signal drops to L level when the transistor PT6 is in on state in the second circuit section 4c1, the period during which the through current flows through the transistor PT6 between the clock signal line HCLK1 for supplying the clock signal and the positive potential (HVDD) can be shortened. In this way, the duration of the through current flowing in the first circuit section 4b1 and the second circuit section 4c1 can be shortened, and therefore the increase in the current consumption of the liquid crystal display can be suppressed.

Also, according to the first embodiment, the transistor PT6 is so configured as to turn off when the transistor PT3 is in on state. Thus, the transistors PT3 and PT6 are not turned on at the same time, and the through current is prevented from flowing in the first circuit section 4b1 and the second circuit section 4c1 at the same time. As a result, the increase in current consumption in the liquid crystal display can be suppressed.

According to the first embodiment, the transistors PT1 to PT6 included in the first circuit section 4b1 and the second circuit section 4c1, the transistors making up the capacitors C1, C2, and the transistors making up the diodes D1, D2 are each constituted of TFTs (thin film transistors) formed of a p-type MOS transistor (field effect transistor). As compared with a case where a shift register circuit including transistors of two operated to types is formed, therefore, the number of ion injection steps and the number of ion injection masks can be reduced. Thus, the fabrication process can be simplified, while at the same time reducing the fabrication cost. Also, the p-type field effect transistor, unlike the n-type field effect transistor, requires no LDD (lightly doped drain) structure, and therefore the fabrication process can be simplified even more.

According to the first embodiment, a high resistance R1 having a resistance value of about 100 kΩ is connected between the transistor PT4 of the second circuit section 4c1 and the clock signal line HCLK1 for supplying the clock signal. Therefore, the transistor PT4 is not easily turned on, so that the response rate for turning on the transistor PT4 of the second circuit section 4c1 is reduced, while at the same time increasing the response rate for turning off the transistor PT4. As a result, the signal output from the second circuit section 4c1 with the transistor PT4 in on state can be delayed, while at the same time the speed of the signal output from the second circuit section 4c1 when the transistor PT4 is in off state can be increased. In this case, when the transistor PT4 of the first-stage shift register circuit 4a1 is turned off with the transistor PT4 turned on in the third-stage shift register circuit 4a3, the response rate of the horizontal switch 3 corresponding to the third-stage shift register circuit 4a3 is reduced, while the response rate of the horizontal switch 3 corresponding to the first-stage shift register circuit 4a1 is increased. Thus, the moment at which the third-stage horizontal switch 3 is turned on from off state and the moment at which the first-stage horizontal switch 3 is turned off from on state can be prevented from being superposed one on the other. The third-stage horizontal switch 3 can be turned on, therefore, only after the first-stage horizontal switch 3 turns off. Therefore, the noises which otherwise might be caused in the video signal by the turning on of the third-stage horizontal switch 3 at the moment the first-stage horizontal switch 3 turns off from on state can be suppressed. Thus, the image deterioration which otherwise might be caused by noises can be prevented.

Second Embodiment

Figure 4:
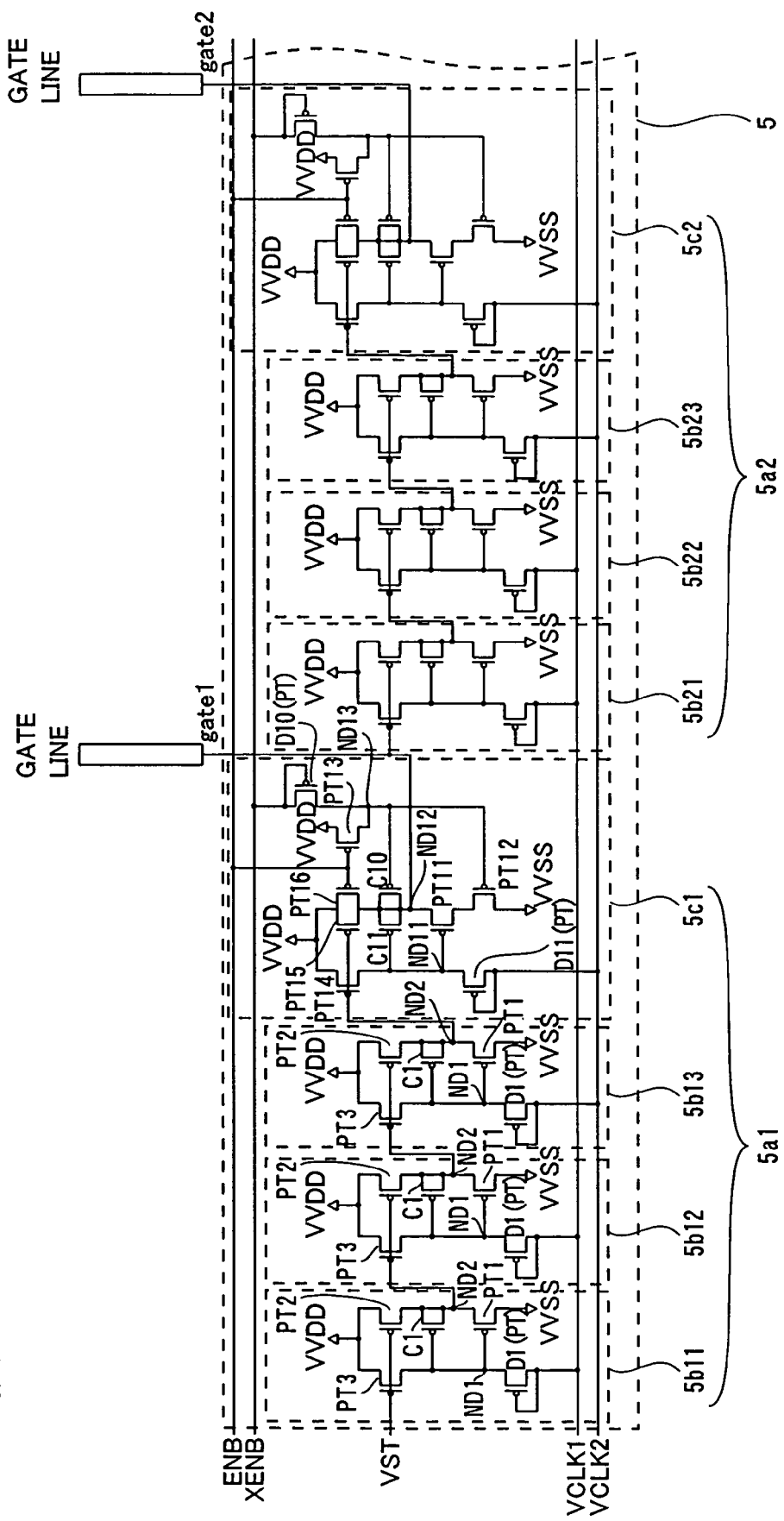
FIG. 4 is a circuit diagram of a shift register circuit constituting the V driver of the liquid crystal display according to a second embodiment of the invention.

With reference to FIG. 4, an explanation is given about the second embodiment, in which, unlike the first embodiment, the invention is applicable to the V driver for driving (scanning) the gate line.

Specifically, the V driver 5 of the liquid crystal display according to the second embodiment, as shown in FIG. 4, includes a plurality of stages of shift register circuits 5a1 and 5a2. In FIG. 4, only two stages of the shift register circuits 5a1 and 5a2 are shown for simplification of the drawing. The first-stage shift register circuit 5a1 is configured of first circuit sections 5b11, 5b12, 5b13 and the second circuit section 5c1. The first circuit section 5b11 of the first-stage shift register circuit 5a1 includes three p-channel transistors (PT1, PT2 and PT3), a capacitor C1 formed by connecting the source and the drain of the p-channel transistors, and a diode D1 formed by diode-connecting the p-channel transistors. The second circuit section 5c1 of the first-stage shift register circuit 5a1 includes six p-channel transistors (PT11, PT12, PT13, PT14, PT15 and PT16), capacitors C10, C11 formed by connecting the source and the drain of the p-channel transistors, and diodes D10, D11 formed by diode-connecting the p-channel transistors. The p-channel transistors PT11, PT12, PT13, PT14, PT15 and PT16 are an example of "the fourth transistor", "the tenth transistor", "the 11th transistor", "the sixth transistor", "the fifth transistor" and "the ninth transistor", respectively, according to the invention. The capacitor C11 is an example of "the second capacitor" according to the invention. The diodes D10, D11 are an example of "the third diode" and "the second diode", respectively, according to the invention. The p-channel transistors PT15, PT16 have the drain and the source thereof connected to each other.

According to the second embodiment, the p-channel transistors PT1 to PT3 and PT11 to PT16 included in the first circuit section 5b11 and the second circuit section 5c1, the p-channel transistors making up the capacitors C1, C10, C11, and the p-channel transistors making up the diodes D1, D10, D11 are each constituted of TFTs (thin film transistors) formed of a p-type MOS transistor (field effect transistor). In this second embodiment, the p-channel transistors PT1 to PT3 and PT11 to PT16 are referred to as the transistors PT1 to PT3 and PT11 to PT16, respectively.

In the first circuit section 5b11, the drain of the transistor PT1 is connected to the negative potential (VVSS). The source of the transistor PT1 is connected to the drain of the transistor PT2. The gate of the transistor PT1 is connected to the clock signal line VCLK1. The source of the transistor PT2 is connected to the positive potential (VVDD). The gate of the transistor PT2 is supplied with a start signal VST. The start signal VST is an example of "the first signal" according to the invention.

According to the second embodiment, the transistor PT3 for turning off the transistor PT1 when the transistor PT2 is in on state is arranged between the node ND1 connected with the gate of the transistor PT1 and the positive potential (VVDD). Thus, the transistor PT2 and the transistor PT1 are prevented from turning on at the same time. The gate of the transistor PT3 is supplied with the start signal VST.

According to the second embodiment, the capacitor C1 is inserted between the gate and the source of the transistor PT1.

Also, the diode D1 is interposed between the node ND1 connected with the gate of the transistor PT1 and the clock signal line VCLK1. The diode D1 prevents the H-level pulse voltage of the clock signal from flowing in reverse direction from the clock signal line VCLK1 to the capacitor C1.

The first circuit sections 5b12 and 5b13 having a similar configuration to the first circuit section 5b11 are connected in series to each other. The node ND2 of the 3rd first circuit section 5b13 is connected with the second circuit section 5c1.

In the second circuit section 5c1, the drain of the transistor PT11 is connected to the source of the transistor PT12. The drain of the transistor PT12 is connected to the negative potential (VVSS). The gate of the transistor PT12 is connected to an XENB signal line (inverted enable signal line) for supplying an XENB signal (inverted enable signal) through the diode D10. The XENB signal is an example of "the third signal" according to the invention, and the XENB signal line an example of "the third signal line" according to the invention. The node ND13 inserted between the gate of the transistor PT12 and the diode D10 is connected to the drain of the transistor PT13. The source of the transistor PT13 is connected with the positive potential (VVDD). The gate of the transistor PT13 is connected to an ENB signal line (enable signal line) for supplying an ENB signal (enable signal). The ENB signal is an example of "the second signal" according to the invention. The capacitor C10 is inserted between the gate and the source of the transistor PT12.

The source of the transistor PT11 is connected to the drains of the transistors PT15 and PT16. The sources of the transistors PT15 and PT16 are connected to the positive potential (VVDD). The gate of the transistor PT15 is connected to the node ND2 of the 3rd first circuit section 5b13. The gate of the transistor PT16 is connected to the ENB signal line.

The transistor PT14 is inserted between the positive potential (VVDD) and the node ND11 connected with the gate of the transistor PT11. The gate of the transistor PT14 is connected to the node ND2 of the 3rd first circuit section 5b13. The capacitor C11 is interposed between the gate and the source of the transistor PT11. The diode D11 is connected between the clock signal line VCLK2 and the node ND11 connected with the gate of the transistor PT11.

The output signal gate1 of the first-stage shift register circuit 5a1 is output from the node ND12 (output node) arranged between the source of the transistor PT11 and the drains of the transistors PT15, PT16. The node ND12 is connected with the gate line. The node ND12 is also connected with the first circuit section 5b21 of the second-stage shift register circuit 5a2. The second-stage shift register circuit 5a2 is configured of the first circuit sections 5b21, 5b22, 5b23 and the second circuit section 5c2. The first circuit sections 5b21, 5b22, 5b23 and the second circuit section 5c2 of the second-stage shift register circuit 5a2 have a similar configuration to the first circuit sections 5b11, 5b12, 5b13 and the second circuit section 5c1, respectively, of the first-stage shift register circuit 5a1.

The output signal gate2 is output from the output node of the second-stage shift register circuit 5a2. This output node is connected with the gate line on the one hand, and the first circuit section of the third-stage shift register circuit (not shown) on the other. The shift register circuits in the third and subsequent stages have a similar configuration to the first-stage shift register circuit 5a1.

Figure 5:
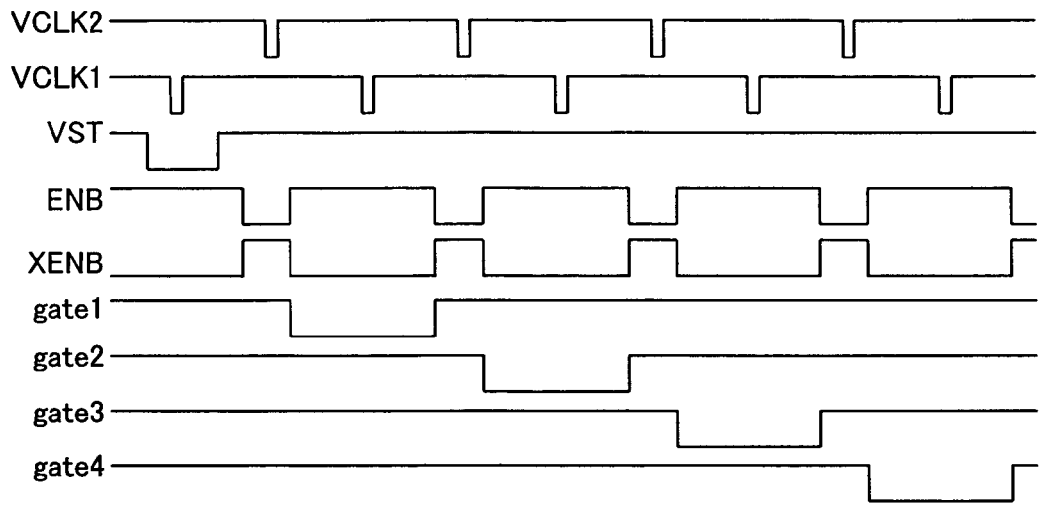
FIG. 5 is a timing chart of a shift register circuit of the V driver for the liquid crystal display according to the second embodiment shown in FIG. 4.

Next, the operation of the shift register circuit of the V driver of the liquid crystal display according to the second embodiment is explained with reference to FIGS. 4 and 5. In FIG. 5, gate1, gate2, gate3 and gate4 designate the output signals output to the gate line from the first-, second-, third- and the fourth-stage shift register circuits, respectively.

The configuration of the first circuit section 5b11 and the first circuit section 5b12 of the shift register circuit 5a1 of the V driver 5 according to the second embodiment shown in FIG. 4 corresponds to the configuration of the first circuit section 4b1 and the second circuit section 4c1 of the shift register circuit 4a1, less the high resistance R1, according to the first embodiment shown in FIG. 2. The operation performed in response to the start signal VST and the clock signal VCLK1 of the first circuit section 5b11 and the first circuit section 5b12 of the shift register circuit 5a1 according to the second embodiment, therefore, corresponds to the operation performed in response to the start signal HST and the clock signal HCLK1 of the first circuit section 4b1 and the second circuit section 4c1 of the shift register circuit 4a1 according to the first embodiment shown in FIG. 2.

Specifically, in the initial mode, the H-level start signal VST is input to the first circuit section 5b11 of the first-stage shift register circuit 5a1. The H-level signal is output from the 2nd first circuit section 5b12 by the operation similar to that of the H driver according to the first embodiment described above. This H-level signal is input to the gates of the transistors PT2 and PT3 of the 3rd first circuit section 5b13. As a result, the transistors PT2, PT3 are turned off, and therefore the L-level signal is output from the 3rd first circuit section 5b13.

The L-level output signal from the 3rd first circuit section 5b13 is input to the gates of the transistors PT14 and PT15 of the second circuit section 5c1. Thus, the transistors PT14, PT15 are turned on. Since the potential of the node ND12 rises to H level in the initial state, the H-level output signal gate1 is output to the gate line from the first-stage shift register circuit 5a1.

In the case where the L-level start signal VST is input under this condition, the H-level signal is output from the 2nd first circuit section 5b12 by the operation similar to that of the H driver according to the first embodiment. Therefore, as in the initial state, the H-level output signal gate1 continues to be output to the gate line from the first-stage shift register circuit 5a1.

Next, when the L-level clock signal is input from the clock signal line VCLK1, the L-level signal is output from the 2nd first circuit section 5b12 by the operation similar to that of the H driver according to the first embodiment described above. This L-level output signal is input to the gates of the transistors PT2, PT3 of the 3rd first circuit section 5b13, and therefore the transistors PT2, PT3 of the 3rd first circuit section 5b13 are turned on. At the same time, since the transistor PT1 of the 3rd first circuit section 5b13 is in off state, the H-level signal is output from the 3rd first circuit section 5b13. This H-level signal is input to the gates of the transistors PT14 and PT15 of the second circuit section 5c1. The transistor PT15 is thus turned off. Since the ENB signal is held at H level, the transistor PT16 is held in off state. Also, since the node ND11 is held floating at H level, the transistor PT11 is also kept turned off. As a result, the H-level output signal gate1 continues to be output to the gate line from the first-stage shift register circuit 5a1.

Also in the case where the start signal VST rises to H level, the L-level signal continues to be output from the 2nd first circuit section 5b12 by the operation similar to that of the H driver according to the first embodiment described above. As a result, the H-level output signal gate1 continues to be output to the gate line from the first-stage shift register circuit 5a1.

With the decrease of the ENB signal to L level, the XENB signal rises to H level. The transistor PT16 supplied with the L-level ENB signal is turned on. The L-level ENB signal is input also to the gate of the transistor PT13, and therefore the transistor PT13 is turned on. The potential of the node ND13 rises to H level, and therefore the transistor PT12 having the gate connected with the node ND13 is turned off. The potential of the node ND12 rises to H level, and therefore the H-level output signal gate1 continues to be output to the gate line from the first-stage shift register circuit 5a1.

With the ENB signal at L level, the L-level clock signal is input from the clock signal line VCLK2 through the diode D1 of the 3rd first circuit section 5b13. In the process, the transistors PT2, PT3 of the 3rd first circuit section 5b13 are in on state, and therefore the potential of the node ND1 of the 3rd first circuit section 5b13 is held at H level. The transistor PT1 of the 3rd first circuit section 5b13 is held in off state, and therefore the H-level signal is output from the 3rd first circuit section 5b13. This H-level output signal is input to the gates of the transistors PT14 and PT15 of the second circuit section 5c1. As a result, the transistors PT14, PT15 are held in off state. Since the gate of the transistor PT16 is supplied with the L-level ENB signal, the transistor PT16 is held in on state.

On the other hand, the second circuit section 5c1 is also supplied with the L-level clock signal from the clock signal line VCLK2 through the diode D11. Since the potential of the node ND11 drops to L level, the transistor PT11 is turned on. In this case, however, the ENB signal is at L level, and therefore the transistor PT13 is held in on state, while the transistor PT12 is held in off state. After all, therefore, the node ND12 is held at H level. Under this condition, the H-level output signal gate1 to the gate line from the first-stage shift register circuit 5a1 is held as it is.

After that, the ENB signal rises to H level, while the XENB signal drops to L level, so that the transistors PT16, PT13 are turned off. The transistor PT12 having the gate thereof supplied with the L-level XENB signal through the diode D10 is turned on. Thus, the transistors PT11, PT12 are turned on, while transistors PT15, PT16 are turned off. Thus, the potential of the node ND12 drops to L level VVSS due to the function of the capacitor C11. The L-level output signal gate1 is output to the gate line from the first-stage shift register circuit 5a1. Also in the case where the clock signal VCLK1 drops to L level under this condition, the output signal gate1 output to the gate line from the first-stage shift register circuit 5a1 is held at L level.

Next, the ENB signal drops to L level, while the XENB signal rises to H level, so that the transistors PT16, PT13 are turned on. The turning on of the transistor PT13 raises the potential of the node ND13 to H level. The transistor PT12 with the gate thereof connected to the node ND13 is turned off. The transistor PT16 is turned on and the transistor PT12 is turned off, thereby raising the potential of the node ND12 to H level. As a result, the H-level output signal gate1 is output to the gate line from the first-stage shift register circuit 5a1.

The H-level output signal gate1 from the first-stage shift register circuit 5a1 is input also to the first circuit section 5b21 of the second-stage shift register circuit 5a2. The shift register circuits in the second and subsequent stages perform the operation similar to that of the first-stage shift register circuit 5a1 in response to the output signal from the shift register circuit in the preceding stage, the clock signals VCLK1, VCLK2, the ENB signal and the XENB signal. Thus, the gate lines of the respective stages are sequentially driven (scanned). In this case, the output of the shift register circuits is forcibly held at H level as long as the ENB signal remains at L level. By reducing the ENB signal to L level at the timing shown in FIG. 5, therefore, the L-level output signals of the shift register circuit in the preceding stage and the shift register circuit in the following stage are prevented from being superposed one on the other.

According to the second embodiment, as described above, the transistor PT3 for turning off the transistor PT1 when the transistor PT2 is in on state is included in the first circuit sections 5b11, 5b12, 5b13. Therefore, the transistor PT1 connected to the negative potential (VVSS) and the transistor PT2 connected to the positive potential (VVDD) are prevented from turning on at the same time. In the first circuit sections 5b11, 5b12, 5b13, therefore, the through current can be prevented from flowing between the negative potential (VVSS) and the positive potential (VVDD) through the transistors PT1, PT2. Also, since the transistor PT14 is included in the second circuit section 5c1 to turn off the transistor PT11 when the transistor PT15 is in on state, the transistor PT11 connected to the negative potential (VVSS) and the transistor PT15 connected to the positive potential (VVDD) are prevented from turning on at the same time. Thus, the through current can be prevented from flowing between the negative potential (VVSS) and the positive potential (VVDD) through the transistors PT11, PT15 in the second circuit section 5c1. In this way, the through current can be prevented from flowing in the first circuit sections 5b11, 5b12, 5b13 and the second circuit section 5c1, and therefore the increase in current consumption of the liquid crystal display can be suppressed.

The other effects of the second embodiment are similar to those of the first embodiment.

Third Embodiment

As a third embodiment, a case is explained below in which the H driver for driving (scanning) the drain line is configured of a n-channel transistor.

Figure 6:
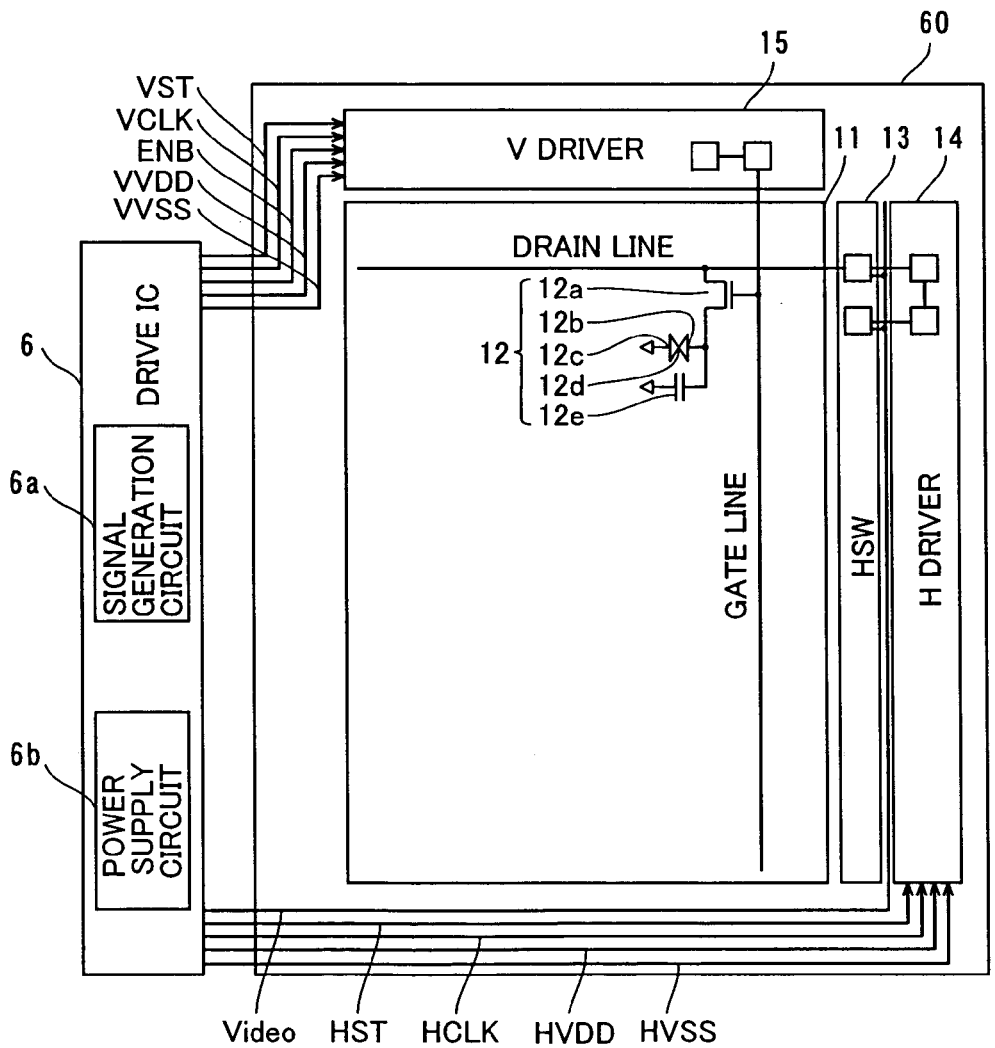
FIG. 6 is a plan view showing a liquid crystal display according to a third embodiment of the invention.

First, in the liquid crystal display according to the third embodiment shown in FIG. 6, a display section 11 is arranged on a substrate 60. The display section 11 shown in FIG. 6 represents the configuration of one pixel. The pixels 12 arranged in matrix form on the display section 11 are each configured of a n-channel transistor 12a, a pixel electrode 12b, an opposite electrode 12c opposed to the pixel electrode 12b and shared by each of the pixels 12, a liquid crystal 12d held between the pixel electrode 12b and the opposite electrode 12c and an auxiliary capacitor 12e. The gate of the n-channel transistor 12a is connected to the gate line. The drain of the n-channel transistor 12a is connected to the drain line. The source of the n-channel transistor 12a is connected to the pixel electrode 12b and the auxiliary capacitor 12e. Along one side of the display section 11, a horizontal switch (HSW) 13 and a H driver 14 for driving (scanning) the drain line of the display section 11 are arranged on the substrate 60. Along the other side of the display section 11, a V driver 15 for driving (scanning) the gate line of the display section 11 is arranged on the substrate 60. Although only two horizontal switches HSW are shown in FIG. 6, horizontal switches in the number corresponding to the number of the pixels are actually arranged. Also, only two shift registers constituting the H drivers 14 and the V drivers are shown. Actually, however, the H drivers and the V drivers in the number corresponding to the number of pixels are arranged.

Figure 7:
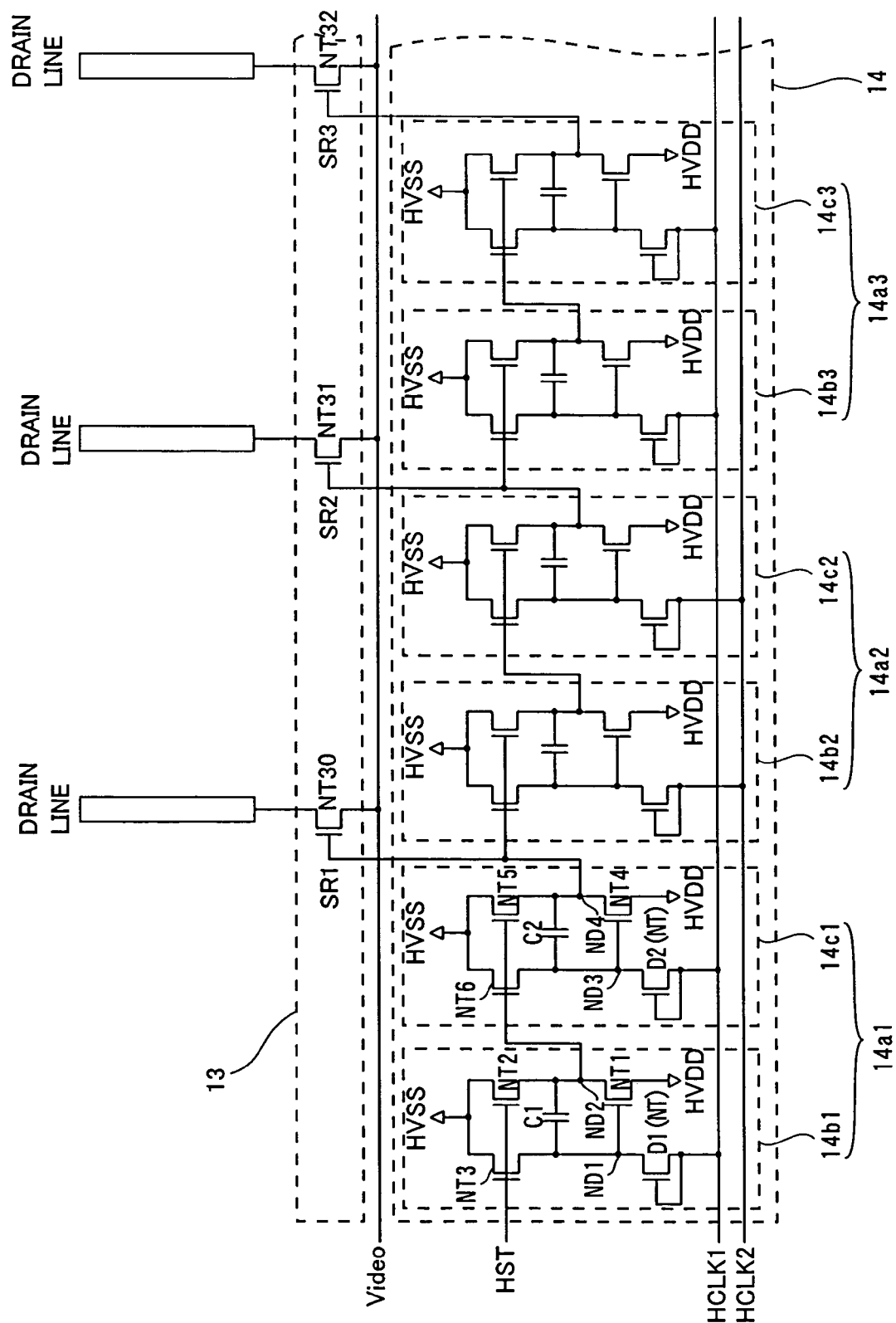
FIG. 7 is a circuit diagram of a shift register circuit constituting a H driver of the liquid crystal display according to the third embodiment shown in FIG. 6.

Referring to FIG. 7, a plurality of shift register circuits 14a1, 14a2, 14a3 are arranged in the H driver 14. In FIG. 7, to simplify the drawing, only the three stages of the shift register circuits 14a1, 14a2, 14a3 are shown. Actually, however, the shift register circuits in the number corresponding to the number of pixels are arranged. The first-stage shift register circuit 14a1 is configured of a first circuit section 14b1 and a second circuit section 14c1. The first circuit section 14b1 of the shift register circuit 14a1 includes three n-channel transistors (NT1, NT2, NT3), a capacitor C1 formed by connecting the source and the drain of the n-channel transistors, and a diode D1 formed by diode-connecting the n-channel transistors. The second circuit section 14c1 of the shift register circuit 14a1, on the other hand, includes three n-channel transistors (NT4, NT5, NT6), a capacitor C2 formed by connecting the source and the drain of the n-channel transistors, and a diode D2 configured of a diode-connected n-channel transistor. In FIG. 7, however, the fact is not shown that the capacitor C1 of the first circuit section 14b1 and the capacitor C2 of the second circuit section 14c1 are formed of a n-channel transistor.

The n-channel transistors NT1, NT2, NT3, NT4, NT5 and NT6 represent an example of "the first transistor", "the second transistor", "the third transistor", "the fourth transistor", "the fifth transistor" and "the sixth transistor", respectively, according to the invention. The diodes D1, D2 are an example of "the first diode" and "the second diode", respectively, according to the invention. The capacitors C1, C2 are an example of "the first capacitor" and "the second capacitor", respectively, according to the invention.

According to the third embodiment, the n-channel transistors NT1 to NT6 included in the first circuit section 14b1 and the second circuit section 14c1, the n-channel transistors making up the capacitors C1, C2 and the n-channel transistors making up the diodes D1, D2 are all configured of TFTs (thin film transistors) formed of n-type MOS transistors (field effect transistors). In this third embodiment, the n-channel transistors NT1 to NT6 are referred to as the transistors NT1 to NT6, respectively.

In the second circuit section 14c1 of the shift register circuit 14a1 according to the third embodiment, unlike in the shift register circuit according to the first embodiment, a high resistance is not connected between the gate of the transistor NT4 and the clock signal line HCLK1. The sources of the transistors NT2, NT3, NT5 and NT6 are connected to the negative potential (HVSS), and the drains of the transistors NT1, NT4 are connected to the positive potential (HVDD). The other component parts of the shift register circuit 14a1 according to the third embodiment are configured in a similar manner to the shift register circuit 4a1 (FIG. 2) according to the first embodiment.

The horizontal switch 13, as shown in FIG. 7, includes a plurality of transistors NT30, NT31, NT32. The gates of the transistors NT30, NT31, NT32 are connected to the outputs SR1, SR2, SR3, respectively, of the first- to third-stage shift registers 14a1 to 14a3. The sources of the transistors NT30 to NT32 are connected to the drain line of each stage. The drains of the transistors NT30 to NT32 are connected to a single video signal line Video.

Figure 8:
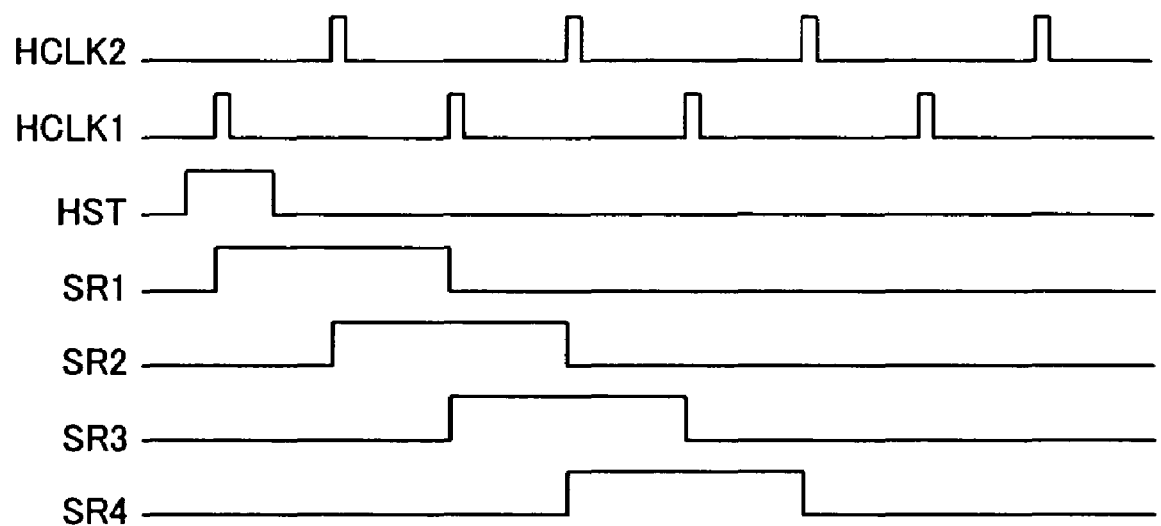
FIG. 8 is a timing chart for a shift register circuit of the H driver of the liquid crystal display according to the third embodiment shown in FIG. 6.

FIG. 8 is a timing chart for the shift register circuit of the H driver of the liquid crystal display according to the third embodiment shown in FIG. 6. Referring to FIG. 8, in the shift register circuit according to the third embodiment, the clock signals HCLK1, HCLK2 shown in the timing chart of the shift register circuit according to the first embodiment shown in FIG. 3 and the signals having a waveform inverted between H and L levels of the start signal HST are input as clock signals HCLK1, HCLK2 and a start signal HST, respectively. As a result, a signal having a waveform inverted between H and L level of the output signals SR1 to SR4 from the shift register circuit according to the first embodiment shown in FIG. 3 is output from the shift register circuit of the liquid crystal display according to the third embodiment. The other operation of the shift register circuit according to the third embodiment is similar to that of the shift register circuit 4a1 according to the first embodiment described above.

According to the third embodiment, the aforementioned configuration makes it possible to produce similar effects to the first embodiment by suppressing the current consumption of the H driver and otherwise.

Fourth Embodiment

As a fourth embodiment, a case is explained in which the V driver for driving (scanning) the gate line is configured of a n-channel transistor.

Figure 9:
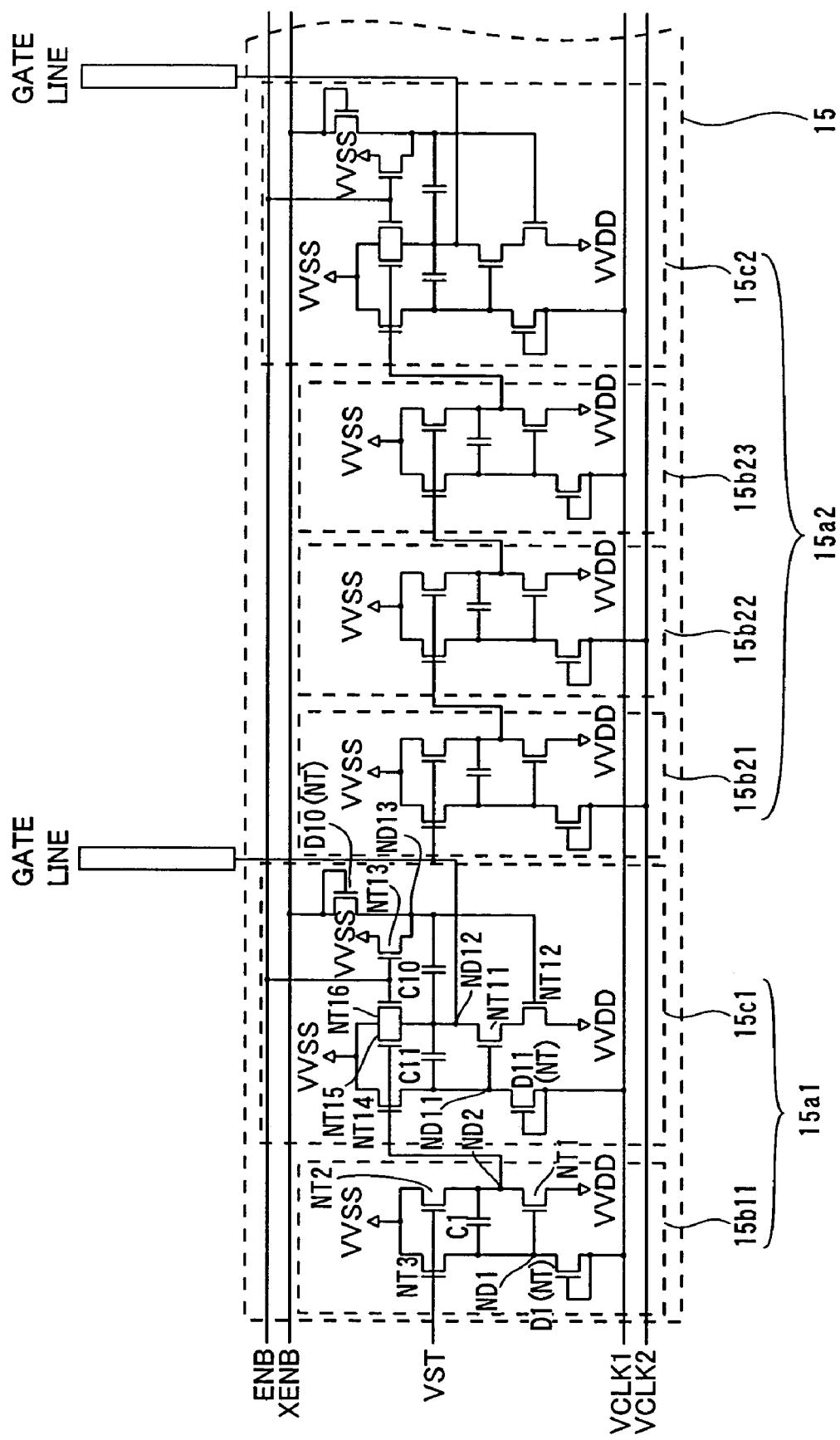
FIG. 9 is a circuit diagram of a shift register circuit constituting the V driver of the liquid crystal display according to a fourth embodiment of the invention.

Referring to FIG. 9, a plurality of stages of shift register circuits 15a1 to 15a2 are arranged in the V driver 15. FIG. 9 shows only two stages of shift registers 15a1, 15a2 for simplification. Actually, however, the stages in the number corresponding to the number of pixels are arranged. The first-stage shift register circuit 15a1 is configured of a first circuit section 15b11 and a second circuit section 15c1. The second-stage shift register circuit 15a2, on the other hand, is configured of three first circuit sections 15b21, 15b22, 15b23 and a second circuit section 15c2. The first circuit sections 15b11, 15b21, 15b22, 15b23 all have a similar circuit configuration. The second circuit section 15c1 and the second circuit section 15c2 have a similar circuit configuration.

The first circuit section 15b11 of the first-stage shift register circuit 15a1 includes three n-channel transistors (NT1, NT2, NT3), a capacitor C1 formed by connecting the source and the drain of the n-channel transistors, and a diode D1 formed by diode-connecting the n-channel transistors. The first circuit section 15c1 of the first-stage shift register circuit 15a1, on the other hand, includes six n-channel transistors (NT11, NT12, NT13, NT14, NT15, NT16), capacitors C10, C11 formed by connecting the source and the drain of the n-channel transistors, and diodes D10, D11 formed by diode-connecting the n-channel transistors. In FIG. 9, however, the fact that the capacitor C1 of the first circuit section 15b11 and the capacitors C10, C11 of the second circuit section 15c1 are formed of a n-channel transistor is not shown. The n-channel transistors NT11, NT12, NT13, NT14, NT15, NT16 represent an example of "the fourth transistor", "the tenth transistor", "the 11th transistor", "the sixth transistor", "the fifth transistor" and "the ninth transistor", respectively, according to the invention. The capacitor C11 represents an example of "the second capacitor" according to the invention. The diodes D10, D11 represent an example of "the third diode" and "the second diode", respectively, according to the invention. The n-channel transistors NT15, NT16 have the drain and the source thereof connected to each other.

According to the fourth embodiment, the n-channel transistors NT1 to NT3 and NT11 to NT16 arranged in the first circuit section 15b11 and the second circuit section 15c1, the n-channel transistors making up the capacitors C1, C10, C11, and the n-channel transistors making up the diodes D1, D10, D11 are all configured of TFTs (thin film transistors) formed of n-type MOS transistors (field effect transistors).

The configuration of the parts other than the shift register circuits 15a1, 15a2 according to the fourth embodiment is similar to that of the shift register circuit 5a1 (FIG. 4) according to the second embodiment.

Figure 10:
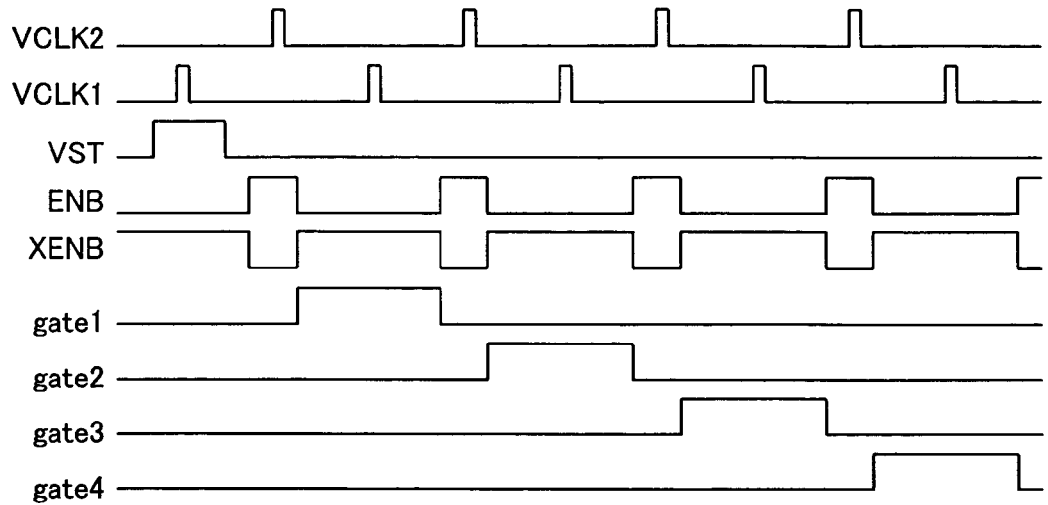
FIG. 10 is a timing chart for a shift register circuit of the V driver of the liquid crystal display according to the fourth embodiment shown in FIG. 9.

Referring to FIG. 10, the shift register circuit of the V driver according to the fourth embodiment is supplied with the clock signals VCLK1, VCLK2 in the timing chart of the shift register circuit according to the second embodiment shown in FIG. 5 and the start signal VST having a waveform with the H and L levels thereof inverted, as clock signals VCLK1, VCLK2 and a start signal VST, respectively. As a result, from the shift register circuit of the V driver of the liquid crystal display according to the fourth embodiment, the output signals gate1 to gate4 having the waveform with inverted H and L levels of the shift register circuit according to the second embodiment shown in FIG. 5 are output. The other operation of the shift register circuit according to the fourth embodiment is similar to that of the shift register circuit 5a1 according to the second embodiment described above.

According to the fourth embodiment, the aforementioned configuration can produce similar effects to the second embodiment by suppressing the current consumption of the V driver or otherwise.

Fifth Embodiment

Figure 11:
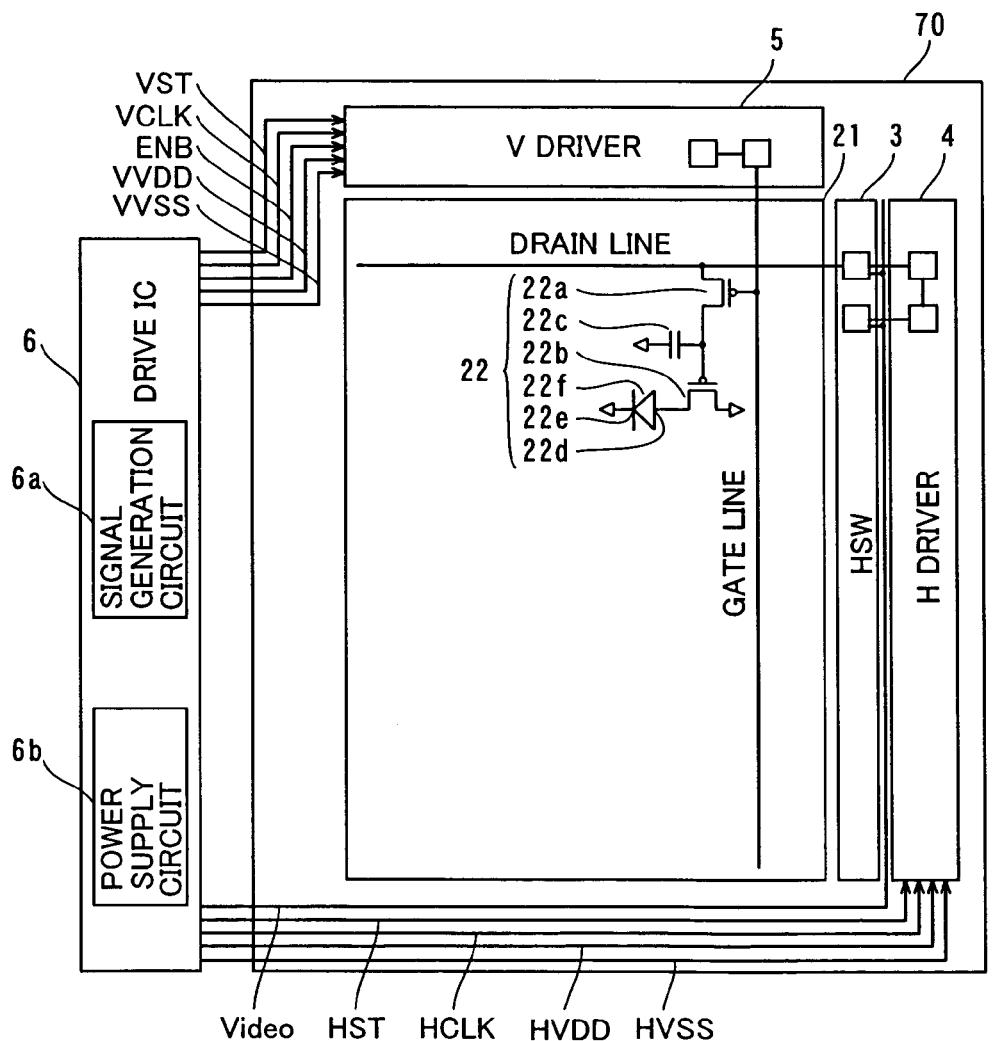
FIG. 11 is a plan view showing an organic EL display according to a fifth embodiment of the invention.

With reference to FIG. 11, an example of application of the invention to an organic EL (electroluminescence) display according to the fifth embodiment is explained.

The organic EL display according to the fifth embodiment includes a display section 21 arranged on a substrate 70 as shown in FIG. 11. The display section 21 shown in FIG. 11 represents a configuration of one pixel. The pixels 22 arranged in matrix form on the display section 21 are each configured of two p-channel transistors 22a, 22b (hereinafter referred to as the transistors 22a, 22b, respectively), an auxiliary capacitor 22c, an anode 22d, a cathode 22e opposed to the anode 22d and an organic EL element 22f sandwiched between the anode 22d and the cathode 22e. The organic EL element 22f is an example of "the EL element" according to the invention. The gate of the transistor 22a is connected to the gate line. The source of the transistor 22a is connected to the drain line. The drain of the transistor 22a is connected to the auxiliary capacitor 22c and the gate of the transistor 22b. The drain of the transistor 22b is connected to the anode 22d. The internal circuit configuration of the H driver 4 is similar to that of the H driver 4 of the shift register circuit using the transistors shown in FIG. 2. The internal circuit configuration of the V driver 5 is similar to that of the V driver 5 of the shift register circuit using the transistor shown in FIG. 4. The configuration of the other parts of the organic EL display according to the fifth embodiment is similar to that of the liquid crystal display according to the first embodiment shown in FIG. 1.

According to the fifth embodiment, the aforementioned configuration of the organic EL display can produce similar effects to the first and second embodiments by suppressing the increase in current consumption of the H driver and the V driver or otherwise.

Sixth Embodiment

Figure 12:
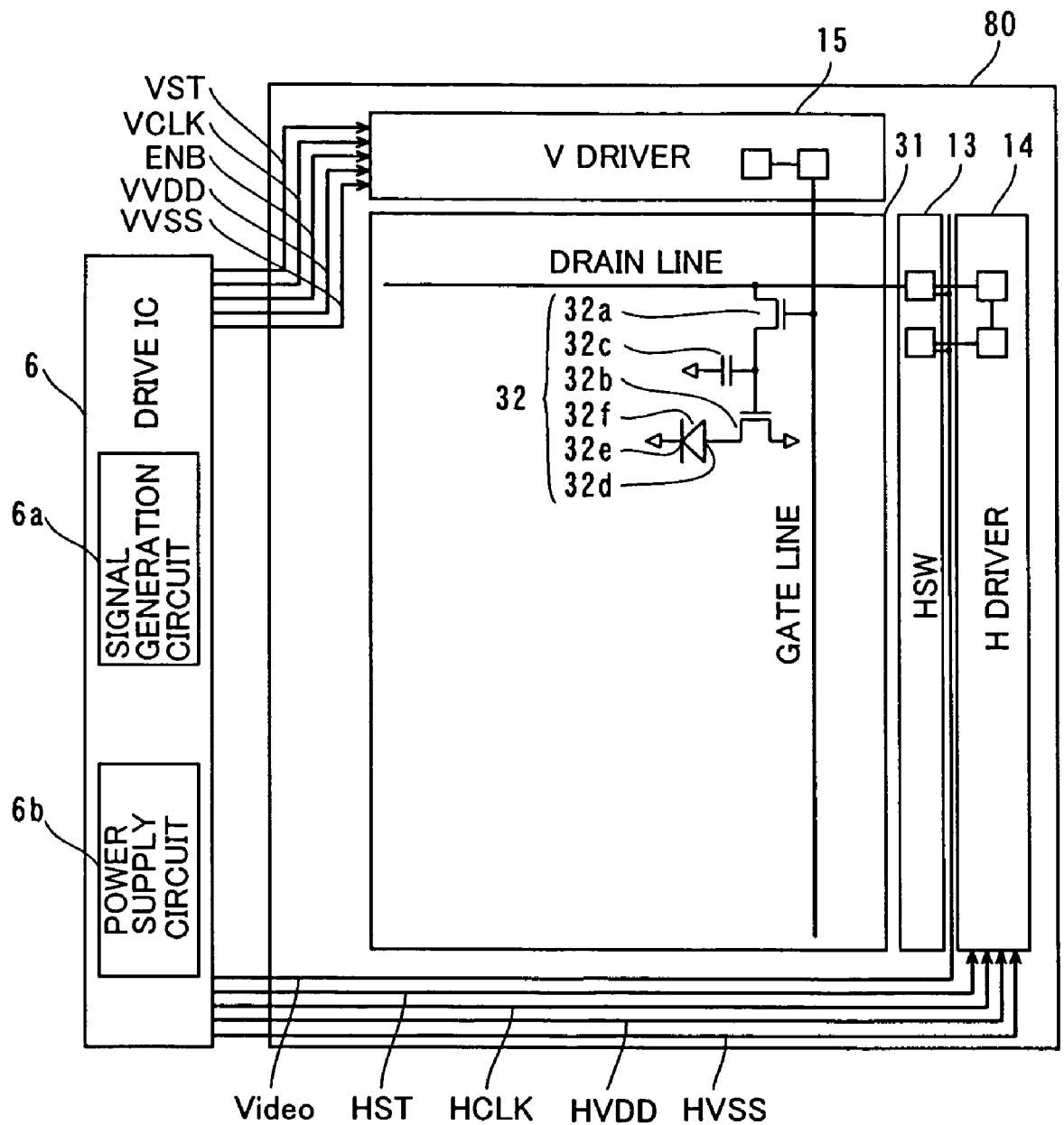
FIG. 12 is a plan view showing an organic EL display according to a sixth embodiment of the invention.
Figure 13:
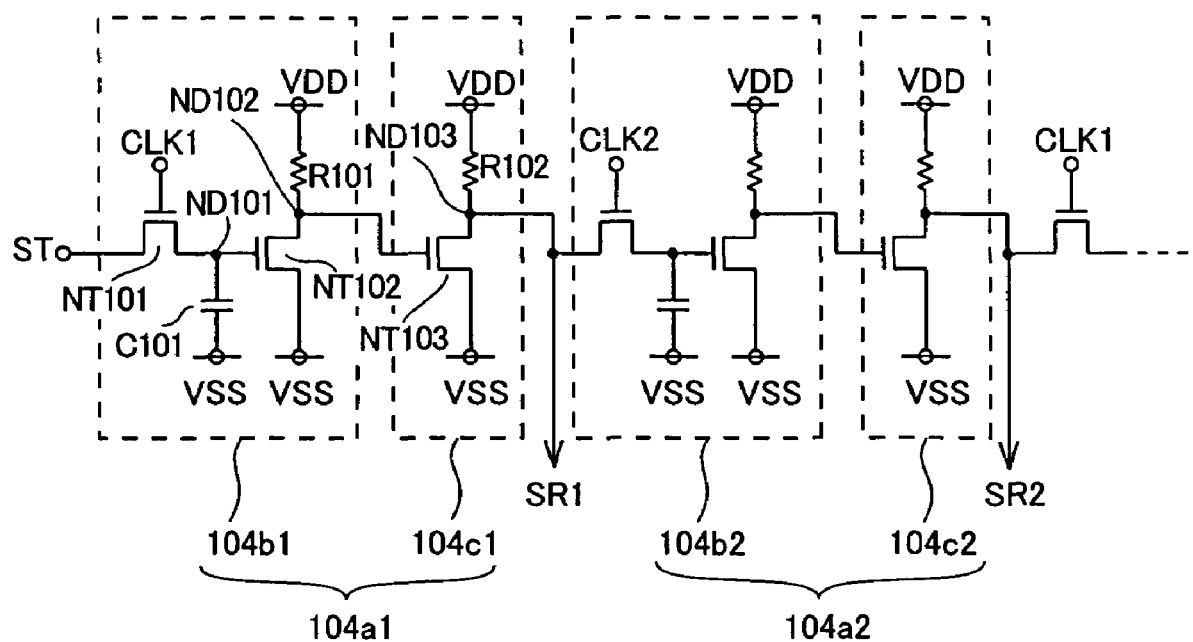
FIG. 13 is a circuit diagram of a shift register circuit having the conventional inverter circuit of resistance load type.
Figure 14:
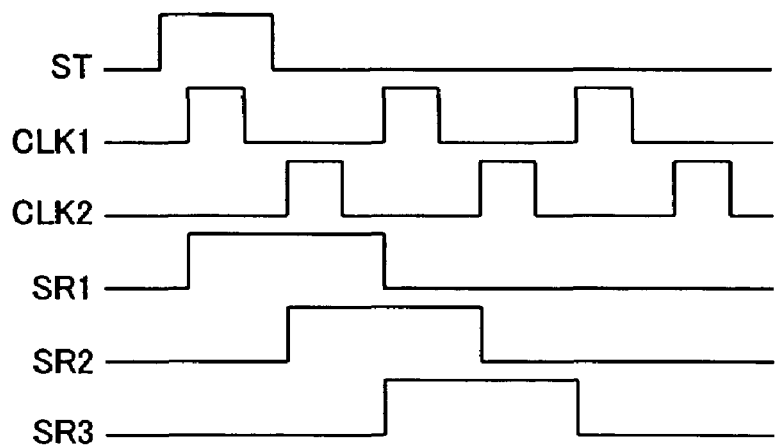
FIG. 14 is a timing chart of the conventional shift register circuit shown in FIG. 13.

With reference to FIG. 12, an example of application of the invention to an organic EL display according to the sixth embodiment is explained.

The organic EL display according to the sixth embodiment includes a display section 31 arranged on a substrate 80 as shown in FIG. 12. The display section 31 shown in FIG. 12 represents a configuration of one pixel. The pixels 32 arranged in matrix form on the display section 31 are each configured of two n-channel transistors 32a, 32b (hereinafter referred to as the transistors 32a, 32b, respectively), an auxiliary capacitor 32c, an anode 32d, a cathode 32e opposed to the anode 32d and an organic EL element 32f sandwiched between the anode 32d and the cathode 32e. The organic EL element 32f is an example of "the EL element" according to the invention. The gate of the transistor 32a is connected to the gate line. The drain of the transistor 32a is connected to the drain line. The source of the transistor 32a is connected to the auxiliary capacitor 32c and the gate of the transistor 32b. The source of the transistor 32b is connected to the anode 32d. The internal circuit configuration of the H driver 14 is similar to that of the H driver 14 of the shift register circuit using the transistors shown in FIG. 7. The internal circuit configuration of the V driver 15 is similar to that of the V driver 15 of the shift register circuit using the transistor shown in FIG. 9. The configuration of the other parts of the organic EL display according to the sixth embodiment is similar to that of the liquid crystal display according to the third embodiment shown in FIG. 6.

According to the sixth embodiment, the aforementioned configuration of the organic EL display can produce similar effects to the third and fourth embodiments by suppressing the increase in current consumption of the H driver and the V driver or otherwise.

The embodiments disclosed herein should be all interpreted as illustrative but not as limitative. The scope of this invention is defined not by the foregoing description of the embodiments but by the claims appended hereto, and includes all modifications thereof without departing from the scope and spirit of the invention.

For example, this invention is applicable to all displays other than the liquid crystal display and the organic EL display described in the embodiments with equal effect.

Also, unlike in the embodiments described above, the shift register circuits according to the invention may be applicable to both the H driver and the V driver. In such a case, the current consumption can be more reduced.

Further, the period during which the clock signal is at L level, unlike in the embodiments described above, may be any time length shorter than the H-level period. In other words, the period during which the clock signal is at L level may be any time length for which the duty factor is less than ½.

What is claimed is:

1. A display comprising a shift register circuit including:
a first circuit section having a first transistor of first conductive type connected to a first potential and operated to turn on in response to a clock signal, a second transistor of first conductive type connected to a second potential, and a third transistor of first conductive type connected between the gate of said first transistor and said second potential and operated to turn off said first transistor when said second transistor is in on state; and
a second circuit section having a fourth transistor of first conductive type connected to said first potential and operated to turn on in response to said clock signal, a fifth transistor of first conductive type connected to said second potential, and a sixth transistor of first conductive type connected between the gate of said fourth transistor and said second potential and operated to turn off when said third transistor is in on state, said sixth transistor being operated to turn off said fourth transistor when said fifth transistor is in on state;
an output positioned between the first and second transistors of the first circuit section being connected to gates of the fifth and sixth transistors of the second circuit section.

2. A display according to claim 1,
wherein a first signal of said first potential is input to the gate of said second transistor and said third transistor, so that said second transistor and said third transistor are turned on, while at the same time changing the gate potential of said first transistor to said second potential through said third transistor in on state thereby to turn off said first transistor.

3. A display according to claim 1,
wherein the output signal of said first circuit section of said first potential is input to the gate of said fifth transistor and said sixth transistor, so that said fifth transistor and said sixth transistor are turned on, while at the same time changing the gate potential of said fourth transistor to said second potential through said sixth transistor in on state thereby to turn off said fourth transistor.

4. A display according to claim 1,
wherein said clock signal is set in such a manner that the period during which the transistor supplied with said clock signal is in on state is shorter than the period during which said transistor is in off state.

5. A display according to claim 4,
wherein the period during which the transistor supplied with said clock signal is in on state is set to not less than about 80 nsec but not more than about 160 nsec.

6. A display according to claim 1,
wherein a first capacitor is connected between the gate and the source of said first transistor, and a second capacitor is connected between the gate and the source of said fourth transistor.

7. A display according to claim 6,
wherein the gate potential of said first transistor is increased or decreased with the increase or decrease in the source potential of said first transistor in such a manner as to maintain the gate-source voltage of said first transistor connected with said first capacitor, and
wherein the gate potential of said fourth transistor is increased or decreased with the increase or decrease in the source potential of said fourth transistor in such a manner as to maintain the gate-source voltage of said fourth transistor connected with said second capacitor.

8. A display according to claim 1,
wherein a first diode is connected between the gate of said first transistor and the clock signal line for supplying said clock signal, and
wherein a second diode is connected between the gate of said fourth transistor and the clock signal line for supplying said clock signal.

9. A display according to claim 8,
wherein said first diode includes a diode-connected seventh transistor of first conductive type, and
wherein said second diode includes a diode-connected eighth transistor of first conductive type.

10. A display according to claim 1,
wherein at least said first transistor, said second transistor, said third transistor, said fourth transistor, said fifth transistor and said sixth transistor are p-type field effect transistors.

11. A display according to claim 9,
wherein said seventh transistor and said eighth transistor are p-type field effect transistors.

12. A display according to claim 1,
wherein a high resistance is connected between said fourth transistor of said second circuit section and the clock signal line for supplying said clock signal.

13. A display according to claim 1,
wherein said shift register circuit includes at least selected one of a shift register circuit for driving a drain line and a shift register circuit for driving a gate line.

14. A display according to claim 1,
wherein a drain line driven by said shift register circuit further includes a display pixel including selected one of a liquid crystal and an EL element.

15. A display according to claim 1,
wherein said shift register circuit is operated to drive a drain line and includes one said first circuit section and one said second circuit section.

16. A display according to claim 1,
wherein said shift register circuit is operated to drive a gate line and includes a plurality of said first circuit sections and one said second circuit section.

17. A display according to claim 16,
wherein said second circuit section further includes a ninth transistor of first conductive type connected between said second potential and said fourth transistor and operated to turn on in response to a second signal, and wherein the output signal of said second potential is output through said ninth transistor when said ninth transistor is in on state.

18. A display according to claim 17,
wherein said second circuit section further includes a tenth transistor of first conductive type connected between said fourth transistor and said first potential, and an 11th transistor of first conductive type connected between the gate of said tenth transistor and said second potential and operated to turn on in response to said second signal, said 11th transistor being operated to turn off said tenth transistor when said ninth transistor is in on state.

19. A display according to claim 18,
wherein a third diode is connected between the gate of said tenth transistor and the third signal line for supplying a third signal inverted from said second signal.

\* \* \* \* \*